(12) United States Patent
Liao et al.

(10) Patent No.: US 12,507,548 B2
(45) Date of Patent: Dec. 23, 2025

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Maoying Liao, Beijing (CN); Hua Tian, Beijing (CN); Yi Qu, Beijing (CN); Siyu Wang, Beijing (CN); Yiding Wang, Beijing (CN); Huijuan Yang, Beijing (CN); Tingliang Liu, Beijing (CN); Yi Zhang, Beijing (CN)

(73) Assignees: CHENGDU BOE OPTOELECTRONICS TECHNOLOGY CO., LTD., Sichuan (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 611 days.

(21) Appl. No.: 17/915,921

(22) PCT Filed: Nov. 4, 2021

(86) PCT No.: PCT/CN2021/128680
§ 371 (c)(1),
(2) Date: Sep. 29, 2022

(87) PCT Pub. No.: WO2022/188442
PCT Pub. Date: Sep. 15, 2022

(65) Prior Publication Data
US 2023/0148053 A1    May 11, 2023

(30) Foreign Application Priority Data
Mar. 9, 2021 (CN) .......................... 202110257346.X

(51) Int. Cl.
*H10K 59/131* (2023.01)
(52) U.S. Cl.
CPC .................................. *H10K 59/131* (2023.02)
(58) Field of Classification Search
CPC ............................ H10K 59/131; H10K 59/12
(Continued)

(56) References Cited

U.S. PATENT DOCUMENTS

2012/0056184 A1* 3/2012 Park ..................... H10K 59/126
 438/34
2015/0123557 A1 5/2015 Lee et al.
(Continued)

FOREIGN PATENT DOCUMENTS

CN       108597374 A        9/2018
CN       111968577 A   *  11/2020  ........... G09G 3/3225
(Continued)

OTHER PUBLICATIONS

First Office Action for Chinese Patent Application No. 202110257346.X issued by the Chinese Patent Office on Mar. 1, 2023.

*Primary Examiner* — Mohammad M Hoque
(74) *Attorney, Agent, or Firm* — XSENSUS LLP

(57) ABSTRACT

A display panel includes: a substrate, and a plurality of pixel circuits, an initial signal line and a plurality of light-emitting devices that are disposed on the substrate. The initial signal line is coupled to the plurality of pixel circuits, and includes a plurality of first signal lines and a plurality of second signal lines, the plurality of second signal lines are farther away from the substrate than the plurality of first signal lines, and the plurality of first signal lines are coupled to the plurality of second signal lines. Each light-emitting device of the plurality of light-emitting devices is coupled to a pixel circuit of the plurality of pixel circuits, the light-emitting device includes a first electrode, and orthographic projec- (Continued)

tions of first electrodes of the plurality of light-emitting devices on the substrate do not overlap with orthographic projections of the plurality of second signal lines on the substrate.

16 Claims, 16 Drawing Sheets

(58) Field of Classification Search
USPC .......................................................... 257/72
See application file for complete search history.

(56) References Cited

U.S. PATENT DOCUMENTS

2017/0061839 A1  3/2017  Park et al.
2019/0325186 A1* 10/2019  Gao ................... G06V 40/1376

FOREIGN PATENT DOCUMENTS

| CN | 112037715 A | 12/2020 |
| CN | 113035925 A | 6/2021 |

\* cited by examiner

DISPLAY PANEL AND DISPLAY DEVICE

CROSS-REFERENCE TO RELATED APPLICATIONS

This application is a national phase entry under 35 USC 371 of International Patent Application No. PCT/CN2021/128680, filed on Nov. 4, 2021, which claims priority to Chinese Patent Application No. 202110257346.X, filed on Mar. 9, 2021, which are incorporated herein by reference in theft entirety.

TECHNICAL FIELD

The present disclosure relates to the field of display technologies, and in particular, to a display panel and a display device.

BACKGROUND

Self-luminous devices, such as active matrix organic light-emitting diodes (AMOLEDs), are widely used in various kinds of terminal display products with high-resolution color screens due to their advantages of high brightness, continuously adjustable color, low cost, quick response, low energy consumption, low driving voltage, wide operating temperature range, simple production process, high luminous efficiency, etc.

SUMMARY

In an aspect, a display panel is provided. The display panel includes a substrate, a plurality of pixel circuits, an initial signal line and a plurality of light-emitting devices. The plurality of pixel circuits, the initial signal line and the plurality of light-emitting devices are disposed on the substrate. The initial signal line is coupled to the plurality of pixel circuits. The initial signal line includes a plurality of first signal lines and a plurality of second signal lines. The plurality of second signal lines are farther away from the substrate than the plurality of first signal lines. The plurality of first signal lines are coupled to the plurality of second signal lines. Each light-emitting device of the plurality of light-emitting devices is coupled to a pixel circuit of the plurality of pixel circuits. The light-emitting device includes a first electrode. Orthographic projections of first electrodes of the plurality of light-emitting devices on the substrate do not overlap with orthographic projections of the plurality of second signal lines on the substrate.

In some embodiments, the first electrodes of the plurality of light-emitting devices are arranged in a same layer as the plurality of second signal lines.

In some embodiments, an extending direction of a second signal line of the plurality of second signal lines intersects an extending direction of a first signal line of the plurality of first signal lines.

In some embodiments, a second signal line of the plurality of second signal lines is coupled to at least two first signal lines of the plurality of first signal lines, and the at least two first signal lines are not necessarily adjacent.

In some embodiments, in an extending direction of the plurality of first signal lines, at least two second signal lines of the plurality of second signal lines coupled to a same first signal line are not necessarily adjacent.

In some embodiments, the display panel further includes a plurality of first conductive patterns. The plurality of first conductive patterns are disposed on the substrate. In a direction perpendicular to a plane where the substrate is located, the plurality of first conductive patterns are located between the plurality of first signal lines and the plurality of second signal lines. A second signal line of the plurality of second signal lines is coupled to a first signal line of the plurality of first signal lines through a first conductive pattern of the plurality of first conductive patterns.

In some embodiments, in a column direction in which the plurality of pixel circuits are arranged, a surface of the first signal line has a protruding portion. An orthographic projection of the protruding portion on the substrate overlaps with an orthographic projection of the first conductive pattern on the substrate.

In some embodiments, the display panel further includes a plurality of second conductive patterns. The plurality of second conductive patterns are disposed on the substrate. The plurality of second conductive patterns are coupled to the plurality of first signal lines. The pixel circuit includes a first reset transistor and a second reset transistor. The first reset transistor and the second reset transistor are each coupled to a second conductive pattern. A second signal line of the plurality of second signal lines is coupled to one of the first reset transistor and the second reset transistor through a second conductive pattern coupled to the one of the first reset transistor and the second reset transistor.

In some embodiments, the display panel further includes at least one third conductive pattern. The at least one third conductive pattern is arranged in a same layer as the plurality of second conductive patterns. An orthographic projection of the at least one third conductive pattern on the substrate and an orthographic projection of at least one second conductive pattern of the plurality of second conductive patterns on the substrate both overlap with an orthographic projection of a first electrode of a light-emitting device of at least one light-emitting device of the plurality of light-emitting devices on the substrate. In a row direction in which the plurality of pixel circuits are arranged, the at least one third conductive pattern and the at least one second conductive pattern are located on two opposite sides of the first electrode of the light-emitting device of the at least one light-emitting device.

In some embodiments, the display panel further includes a plurality of power supply voltage lines. The plurality of power supply voltage lines are disposed on the substrate. The plurality of power supply voltage lines are arranged in a same layer as the at least one third conductive pattern, and the at least one third conductive pattern is in contact with at least one power supply voltage line of the plurality of power supply voltage lines.

In some embodiments, the display panel further includes at least one fourth conductive pattern. The at least one fourth conductive pattern is disposed on the substrate. The at least one fourth conductive pattern is arranged in a same layer as the plurality of first signal lines, and the at least one fourth conductive pattern is coupled to one or more power supply voltage lines of the plurality of power supply voltage lines. The pixel circuit further includes a driving transistor. The driving transistor is coupled to the first reset transistor, An orthographic projection of a fourth conductive pattern of the at least one fourth conductive pattern on the substrate overlaps with an orthographic projection of the first reset transistor on the substrate.

In some embodiments, the pixel circuit further includes a compensation transistor. The compensation transistor is coupled to the driving transistor and the first reset transistor. The orthographic projection of the fourth conductive pattern on the substrate further overlaps with an orthographic projection of the compensation transistor on the substrate.

In some embodiments, the display panel further includes a plurality of data lines. The plurality of data lines are disposed on the substrate and arranged in a same layer as the plurality of power supply voltage lines. An orthographic projection of the at least one fourth conductive pattern on the substrate does not overlap with orthographic projections of the plurality of data lines on the substrate.

In some embodiments, the display panel further includes at least one fifth conductive pattern. The at least one fifth conductive pattern is disposed on the substrate and arranged in a same layer as the plurality of data lines. An orthographic projection of at least one data line of the plurality of data lines on the substrate and an orthographic projection of the at least one fifth conductive pattern on the substrate both overlap with an orthographic projection of a first electrode of a light-emitting device of one or more light-emitting devices of the plurality of light-emitting devices on the substrate. In a row direction in which the plurality of pixel circuits are arranged, the at least one fifth conductive pattern and the at least one data line are located on two opposite sides of the first electrode of the light-emitting device of the one or more light-emitting devices.

In another aspect, a display device is provided. The display device includes the display panel as described in any of the above embodiments and a driving chip. The in driving chip is coupled to the display panel. The driving chip is configured to provide signals to the display panel.

BRIEF DESCRIPTION OF THE DRAWINGS

In order to describe technical solutions in the present disclosure more clearly, the accompanying drawings to be used in some embodiments of the present disclosure will be introduced briefly below. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, but are not limitations on actual sizes of products, actual processes of methods and actual timings of signals involved in the embodiments of the present disclosure.

DETAILED DESCRIPTION

Figure 1:
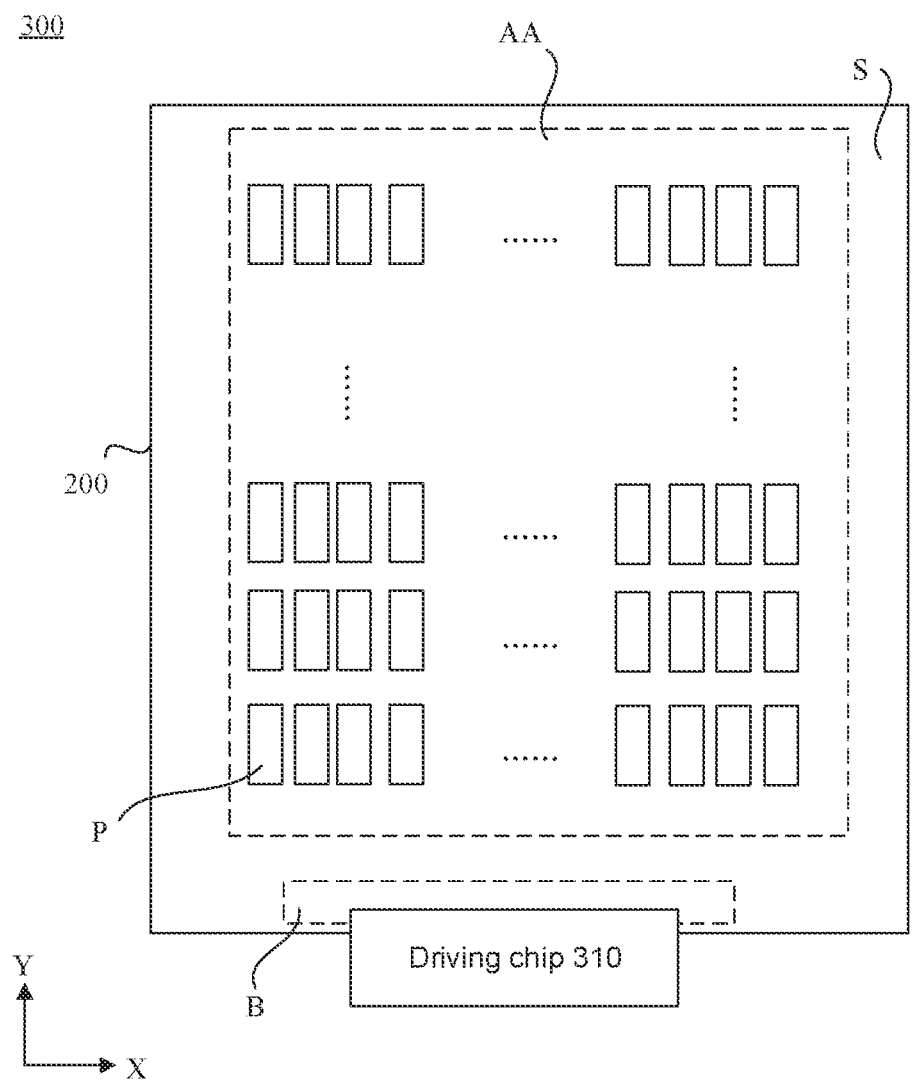
FIG. 1 is a schematic structural diagram of a display device, in accordance with some embodiments.

Technical solutions in some embodiments of the present disclosure will be described dearly and completely below with reference to the accompanying drawings. However, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed in an open and inclusive sense, i.e., "including, but not limited to". In the description of the specification, the terms such as "one embodiment", "some embodiments", "exemplary embodiments", "example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms "first" and "second" are used for descriptive purposes only, but are not to be construed as indicating or implying the relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

In the description of some embodiments, the terms "coupled", "connected" and their derivatives may be used. For example, the term "connected" may be used in the description of some embodiments to indicate that two or more components are in direct physical or electrical contact with each other. For another example, the term "coupled" may be used in the description of some embodiments to indicate that two or more components are in direct physical or electrical contact with each other. However, the term "coupled" or "communicatively coupled" may also mean that two or more components are not in direct contact with each other, but still cooperate or interact with each other. The embodiments disclosed herein are not necessarily limited to the content herein.

The phrase "suitable for" or "configured to" as used herein indicates an open and inclusive expression, which does not exclude devices that are applicable to or configured to perform additional tasks or steps.

As used herein, the term "about" or "approximately" includes a stated value and an average value within an acceptable deviation range of a specific value. The acceptable deviation range is determined by a person of ordinary skill in the art in consideration of the measurement in question and errors associated with the measurement of a particular quantity (i.e., limitations of the measurement system).

Exemplary embodiments are described herein with reference to sectional views and/or plan views as idealized exemplary drawings. In the accompanying drawings, the thicknesses of layers and areas of regions are enlarged for clarity. Variations in shapes with respect to the accompanying drawings due to, for example, manufacturing technologies and/or tolerances may be envisaged. Therefore, the exemplary embodiments should not be construed as being limited to the shapes of the regions shown herein, but including deviations in the shapes due to, for example, manufacturing. For example, an etched region shown in a rectangular shape generally has a feature of being curved. Therefore, the regions shown in the accompanying drawings are schematic in nature, and their shapes are not intended to show actual shapes of regions in a device, and are not intended to limit the scope of the exemplary embodiments.

Some embodiments of the present disclosure provide a display device. For example, the display device may be any device that displays an image whether in motion (e.g., a video) or stationary (e.g., a static image), and whether textual or graphical. More specifically, the display device may be one of a variety of electronic devices, and the described embodiments may be implemented in or associated with a variety of electronic devices. The variety of electronic devices include (but are not limited to), for example, mobile telephones, wireless devices, personal digital assistants (PDAs), hand-held or portable computers, global positioning system (GPS) receivers/navigators, cameras, MPEG-4 Part 14 (MP4) video players, video cameras, game consoles, watches, clocks, calculators, television (TV) monitors, flat-panel displays, computer monitors, car displays (e.g., odometer displays), navigators, cockpit controllers and/or displays, camera view displays (e.g., displays of rear view cameras in vehicles), electronic photos, electronic billboards or signs, projectors, architectural structures, and packagings and aesthetic structures (e.g., displays for displaying an image of a piece of jewelry). The embodiments of the present disclosure do not limit a specific form of the display device.

In some embodiments, as shown in FIG. 1, the display device 300 includes a display panel 200. The display panel 200 has a display region AA and a peripheral region S. The peripheral region S is located on at least one side of the display region AA.

The display panel 200 includes a plurality of sub-pixels P disposed in the display region AA. For example, the plurality of sub-pixels P include sub-pixels of a first color, sub-pixels of a second color and sub-pixels of a third color. For example, the first color, the second color and the third color are three primary colors. For example, the first color, the second color and the third color are red, green and blue, respectively. That is, the plurality of sub-pixels include red sub-pixels, green sub-pixels and blue sub-pixels.

For example, as shown in FIG. 1 the display device 300 further includes a in driving chip 310. The driving chip 310 is coupled to the display panel 200. For example, the peripheral region S of the display panel 200 includes a bonding region B. In the bonding region B of the display panel 200, the driving chip 310 is bonded to the display panel 200. For example, the driving chip 310 is a driver integrated circuit (IC). For example, the driver IC includes a source driver. The driving chip 310 is configured to provide signals for the display panel. The drive signals include, for example, data signals and an initial signal.

For example, the display region in the display panel includes a proximal region proximate to the bonding region (or a connection position of the driving chip and the display panel), a distal region away from the bonding region, and a central region between the distal region and the proximal region. For example, a ratio of the area of the proximal region to the area of the display region is in a range of ⅛ to ⅓, inclusive; for example, the area of the proximal region accounts for ⅙ of the area of the display region. A ratio of the area of the central region to the area of the display region is in a range of ⅛ to ⅓, inclusive; for example, the area of the central region accounts for ⅙ of the area of the display region. A ratio of the area of the distal region to the area of the display region is in a range of ⅛ to ⅓, inclusive; for example, the area of the distal region accounts for ⅙ of the area of the display region.

The driving chip provides signals to the display panel, and there is a voltage drop on the signal line during the transmission of the signal. Therefore, in the transmission process of the signals from the proximal region to the distal region, the impedances of the signal lines gradually increase, and the voltages of the signals gradually decreases. That is, in the proximal region, the voltages of the signals received by the display panel are relatively large, and in the distal region, the voltages of the signals received by the display panel are relatively small. Thus, the difference between the voltages of the in signals received by portions of the display panel in the proximal region and the distal region is relatively large, resulting in a significant difference in the brightness of the display panel during the display process and a poor display effect.

Figure 2:
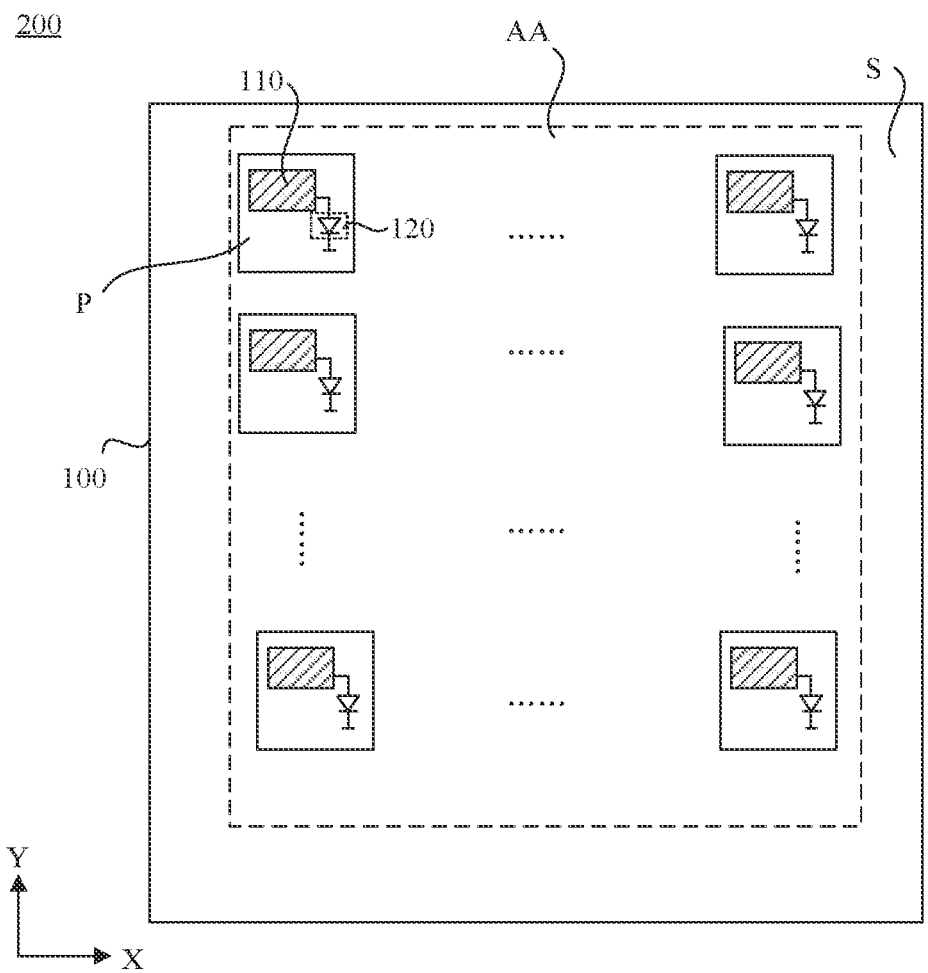
FIG. 2 is a schematic structural diagram of a display panel, in accordance with some embodiments.

In some embodiments, as shown in FIG. 2, the display panel 200 includes a substrate 100, and a plurality of pixel circuits 110 and a plurality of light-emitting devices 120 disposed on the substrate 100. For example, the plurality of light-emitting devices are farther away from the substrate than the plurality of pixel circuits. For example, as shown in FIG. 2, at least one sub-pixel P (e.g., each sub-pixel P) includes a pixel circuit 110 and a light-emitting device 120. The pixel circuit 110 is coupled to the light-emitting device 120. The pixel circuit 110 is configured to drive the light-emitting device 120 to emit light.

For example, the substrate 100 is a rigid substrate such as a glass substrate, or a flexible substrate such as a polyimide (PI) substrate. The rigid substrate or flexible substrate is provided with a buffer layer and other thin films therein.

For example, the pixel circuits are arranged in an array. For example, the pixel circuits 110 arranged in a line in a first direction X in FIG. 2 are referred to as a same row of pixel circuits; that is, the first direction X may be referred to as a row direction in which the plurality of pixel circuits are arranged. The pixel circuits 110 arranged in a line in a second direction Y in FIG. 2 are referred to as a same column of pixel circuits; that is, the second direction Y may be referred to as a column direction in which the plurality of pixel circuits are arranged. For example, both the first direction X and the second direction Y are parallel to a plane where the substrate is located.

The embodiments of the present disclosure do not limit the specific structure of the pixel circuit, which may be designed according to actual conditions. For example, the pixel circuit is composed of a thin film transistor (TFT), a capacitor (C), and other electronic devices. For example, the pixel circuit includes two TFTs (a switching transistor and a driving transistor) and a capacitor, which constitute a 2T1C structure. Of course, the pixel circuit may also include more than two TFTs (a plurality of switching transistors and a driving transistor) and at least one capacitor. For example, referring to FIG. 3, the pixel circuit 110 includes a capacitor (i.e., a storage capacitor) Cst and seven transistors (six switching transistors M1, M2, M3, M4, M5 and M6, and one driving transistor MD), which constitute a 7T1C structure.

Figure 3:
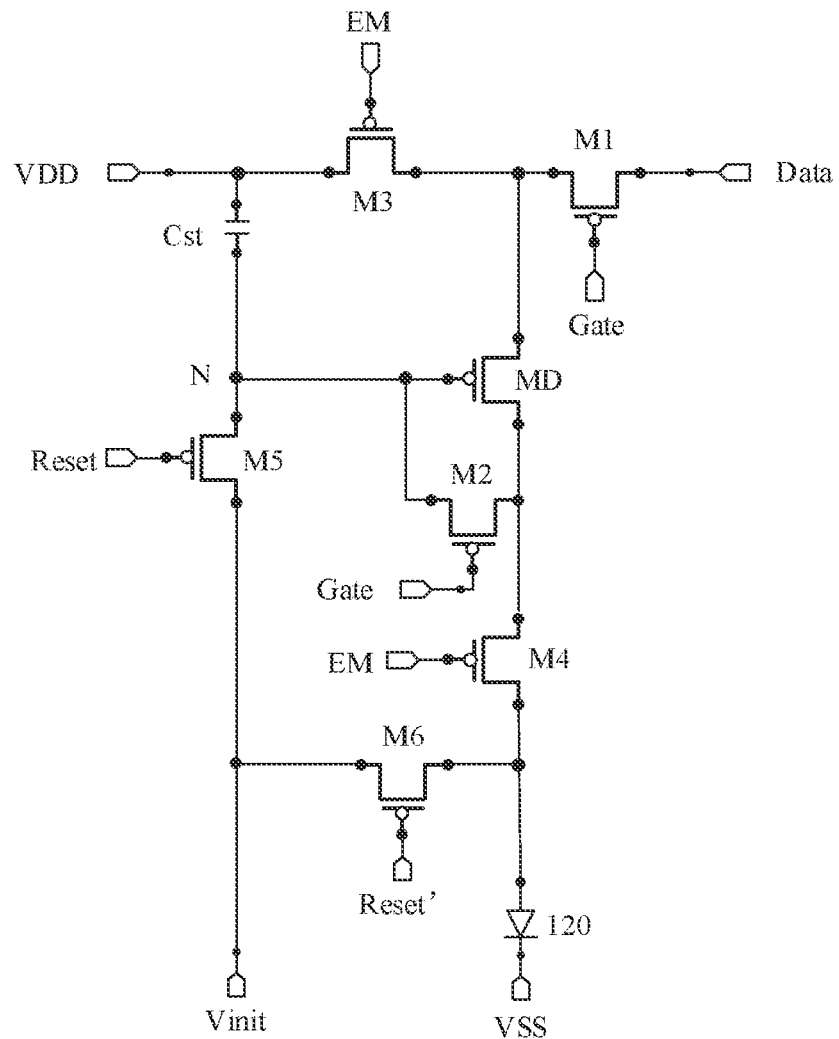
FIG. 3 is a circuit diagram of a pixel circuit, in accordance with some embodiments.

For example, as shown in FIG. 3, control electrodes (e.g., gates) of a part of the switching transistors (e.g., the first reset transistor M5 and the second reset transistor M6) are each used to receive a reset signal (for example, a control electrode of the first reset transistor M5 is used to receive a reset signal Reset, and a control electrode of the second reset transistor M6 is used to receive a reset signal Reset'). Control electrodes of another part of the switching transistors (e.g., the writing transistor M1 and the compensation transistor M2) are used to receive gate driving signals Gate. Control electrodes of yet another part of the switching transistors (e.g., the first light-emitting control transistor M3 and the second light-emitting control transistor M4) are used to receive light-emitting control signals EM. For example, the first reset transistor M5 and the second reset transistor M6 are each turned on in response to the reset signal, the first reset transistor M5 transmits the initial signal Vinit to a control electrode of the driving transistor MD, and the second reset transistor M6 transmits the initial signal Vinit to a first electrode (i.e., an anode) of the light-emitting device 120, respectively, so as to achieve the purpose of resetting the first electrode of the light-emitting device 120 and the control electrode of the driving transistor MD. Under control of the gate driving signal, the compensation transistor M2 is turned on; therefore, the control electrode of the driving transistor MD is coupled to a second electrode (e.g., one of a source and a drain) of the driving transistor MD, and the driving transistor MD is in a diode-conducting state. At this time, a data signal Data is written into a first electrode (e.g., the other of the source and the drain) of the driving transistor MD through the writing transistor M1, so as to compensate a threshold voltage of the driving transistor MD. Under control of the light-emitting control signal, the first light-emitting control transistor M3 and the second light-emitting control transistor M4 are turned on, and a current path between a first power supply signal (e.g., a direct current (DC) high level voltage VDD) and a second power supply signal (e.g., a DC low level voltage VSS) is turned on. A driving current generated by the driving transistor MD is transmitted to the light-emitting device 120 through the current path, so as to drive the light-emitting device 120 to emit light. For example, the first electrode (e.g., the anode) of the light-emitting device 120 receives the driving current from the pixel circuit, and a second electrode (e.g., a cathode) of the light-emitting device 120 is coupled to a fixed voltage terminal. For example, the fixed voltage terminal is configured to transmit a DC voltage, such as the DC low level voltage VSS; that is, the second electrode of the light-emitting device 120 receives the DC low level voltage VSS.

For example, the plurality of light-emitting devices include light-emitting devices of a first color, light-emitting devices of a second color, and light-emitting devices of a third color. For example, the first color, the second color, and the third color are three primary colors. For example, the first color, the second color, and the third color are red, green, and blue, respectively. That is, the plurality of light-emitting devices include red light-emitting devices, green light-emitting devices, and blue light-emitting devices. For example, the light-emitting device of the first color is included in the sub-pixel of the first color, the light-emitting device of the second color is included in the sub-pixel of the second color, and the light-emitting device of the third color is included in the sub-pixel of the third color.

For example, the light-emitting device is a light-emitting diode (LED), a micro light-emitting diode (Micro LED), a mini light-emitting diode (Mini LED), an organic light-emitting diode (OLED), a quantum dot LED (QLED), or other current-driven light-emitting devices.

Figure 4:
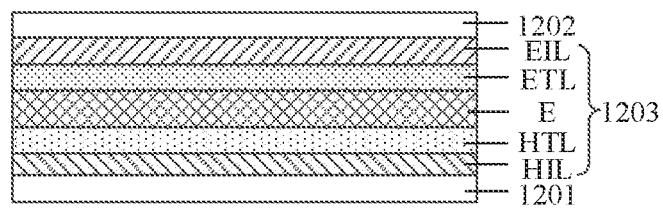
FIG. 4 is a schematic structural diagram of a light-emitting device, in accordance with some embodiments.

For example, as shown in FIG. 4, the light-emitting device 120 includes the first electrode 1201, the second electrode 1202 and a light-emitting functional layer 1203 disposed therebetween. For example, the first electrode of the light-emitting device is an anode, and the second electrode thereof is a cathode. The light-emitting functional layer 1203 includes, for example, a light-emitting layer E, a hole transporting layer (HTL) disposed between the light-emitting layer E and the first electrode 1201, and an electron transporting layer (ETL) disposed between the light-emitting layer E and the second electrode 1202. Of course, in some embodiments, a hole injection layer (HIL) may be provided between the HTL and the first electrode 1201, and an electron injection layer (EIL) may be provided between the ETL and the second electrode 1202, according to actual needs.

For example, the anode may be made of, for example, a transparent conductive material with a high work function, and the electrode material of the anode may include indium tin oxide (ITO), indium zinc oxide (IZO), indium gallium oxide (IGO), gallium zinc oxide (GZO), zinc oxide (ZnO), indium oxide ($In_2O_3$), aluminum doped zinc oxide (AZO) and carbon nanotubes. For example, the cathode may be made of a material with a high conductivity and low work function, and the electrode material of the cathode may include a magnesium aluminum alloy (MgAl), a lithium aluminum alloy (LiAl) and other alloys, or magnesium (Mg), aluminum (Al), lithium (Li), silver (Ag) and other pure metals. The material of the light-emitting layer may be selected according to the color of the in emitted light. For example, the material of the light-emitting layer includes a fluorescent light-emitting material or a phosphorescent light-emitting material. For example, in at least one embodiment of the present disclosure, the light-emitting layer involves a doping process, that is, adding a doping material into a host light-emitting material to obtain a usable light-emitting material. For example, the host light-emitting material may be a metal compound material, a derivative of anthracene, an aromatic diamine compound, a triphenylamine compound, an aromatic triamine compound, a derivative of biphenyl diamine, or a triarylamine polymer, etc.

For example, sizes of first electrodes of light-emitting devices of different colors may be different. For example, an area of an orthographic projection of a first electrode of the red light-emitting device on the substrate is smaller than an area of an orthographic projection of a first electrode of the blue light-emitting device on the substrate; and the area of the orthographic projection of the first electrode of the red light-emitting device on the substrate is larger than an area of an orthographic projection of a first electrode of the green light-emitting device on the substrate. For example, a shape of the first electrode of the light-emitting device may be designed according to actual situations, which is not limited here. For example, the orthographic projection of the first electrode of the red light-emitting device on the substrate may be in a shape of a hexagonal or an approximate hexagonal; the orthographic projection of the first electrode of the blue light-emitting device on the substrate may be in a shape of a hexagonal or an approximate hexagonal; and the orthographic projection of the first electrode of the green light-emitting device on the substrate may be in a shape of a pentagon or an approximate pentagon.

Figure 5:
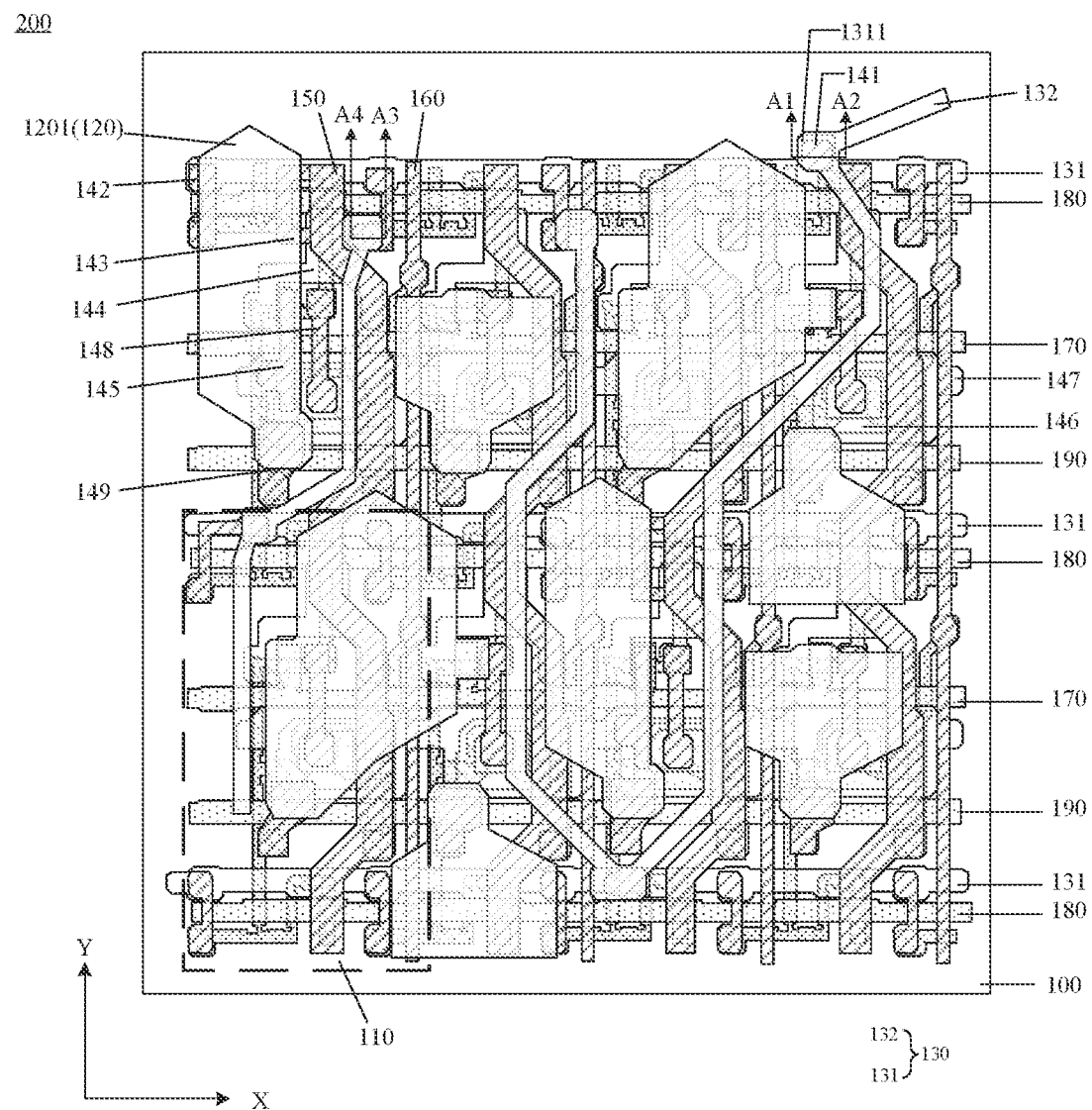
FIG. 5 is a schematic structural diagram of another display panel, in accordance with some embodiments.

In some embodiments, as shown in FIG. 5, the display panel 200 further includes an initial signal line 130. The initial signal line 130 is disposed on the substrate 100. For example, the initial signal line is configured to transmit the initial signal Vinit. For example, the initial signal is a fixed level signal; for example, the fixed level signal is a DC signal; for example, the DC signal is a DC low level signal or a DC high level signal.

For example, the initial signal line 130 includes a plurality of first signal lines 131 and a plurality of second signal lines 132. The plurality of second signal lines 132 are farther away from the substrate 100 than the plurality of first signal lines 131; that is, the plurality of second signal lines 132 are located on a side of the plurality of first signal lines 131 away from the substrate 100; that is, the plurality of first signal lines 131 and the plurality of second signal lines 132 are arranged in different layers. The plurality of first signal lines 131 are coupled to the plurality of second signal lines 132. For example, the first signal lines each transmit the initial signal, the second signal line is coupled to first signal lines, and potentials of signals transmitted on the first signal lines coupled to the second signal line are the same or approximately the same. Thus, the voltage drop on different first signal lines during the transmission of the initial signal may be reduced; the voltage drop on the initial signal lines may be reduced; and the uniformity of the initial signal in the display panel is ensured.

For example, if the initial signal line in the display panel only includes the plurality of first signal lines, then a driving current provided by a pixel circuit in the central region to a light-emitting device (e.g., a blue light-emitting device) is about 16.924 nA; a driving current provided by a pixel circuit in the proximal region to a light-emitting device (e.g., a blue light-emitting device) is about 15.825 nA, which is 6.49% different from the driving current provided by the pixel circuit in the central region; and a driving current provided by a pixel circuit in the distal region to a light-emitting device (e.g., a blue light-emitting device) is about 18.415 nA, which is 8.81% different from the driving current provided by the pixel circuit in the central region. For example, if the initial signal line in the display panel include the plurality of first signal lines and the plurality of second signal lines, then the driving current provided by the pixel circuit in the central region to the light-emitting device (e.g., the blue light-emitting device) is about 16.530 nA; the driving current provided by the pixel circuit in the proximal region to the light-emitting device (e.g., the blue light-emitting device) is about 15.690 nA, which is 5.08% different from the driving current provided by the pixel circuit in the central region; and the driving current provided by the pixel circuit in the distal region to the light-emitting device (e.g., the blue light-emitting device) is about 17.537 nA, which is 6.09% different from the driving current provided by the pixel circuit in the central region. Thus, the display panel provided in the embodiments of the present disclosure may reduce the impedance of the initial signal line during transmission, and reduce the difference of the driving currents provided by pixel circuits in different locations to the light-emitting devices. Therefore, the uniformity of the driving currents may be improved, and the difference of the brightness of the light-emitting devices may be reduced, and thus the uniformity of the display brightness may be improved.

Orthographic projections of the first electrodes 1201 of the plurality of light-emitting devices 120 on the substrate 100 do not overlap with orthographic projections of the plurality of second signal lines 132 on the substrate 100. In this way, the plurality of second signal lines will not affect the planarity of the first electrodes of the plurality of light-emitting devices. As a result, the thickness of the first electrode is relatively uniform, and a surface of the first electrode proximate to the substrate and a surface of the first electrode away from the substrate are relatively flat with no slope.

For example, if the orthographic projection of the second signal line on the substrate overlaps with the orthographic projection of the first electrode of the light-emitting device on the substrate, a thickness of an insulating layer (e.g., a planarization layer) between a layer where the second signal lines are located and a layer where the first electrodes are located will vary. That is, there will be a step difference on the surface of the first electrode proximate to the substrate, resulting in reduced planarity of the surface of the first electrode proximate to the substrate. Consequently, the thickness of the first electrode of the light-emitting device is uneven. For example, the surface of the first electrode away from the substrate and the surface of the first electrode proximate to the substrate are both inclined, and surfaces of the first electrodes of the light-emitting devices of different colors are inclined to different degrees. Therefore, the luminous intensity of the light-emitting devices of different colors varies greatly, and the display brightness of sub-pixels of different colors varies greatly. As a result, the display difference of adjacent sub-pixels is also very large, causing the display panel to have a problem of color cast at large viewing angles. For example, the user may see that the display panel appears reddish at one side and bluish at another side, which is a display anomaly.

On this basis, by arranging that the orthographic projections of the first electrodes of the plurality of light-emitting devices on the substrate do not overlap with the orthographic projections of the plurality of second signal lines on the substrate, it may be possible to avoid the problem of uneven brightness caused by uneven thickness of the first electrodes of the light-emitting devices in the display panel, ensure the planarity of the layer where the first electrodes of the light-emitting devices in the display panel are located, and thereby improve the light-emitting effect of the light-emitting devices and improve the display effect of the display panel.

Therefore, in the display panel provided in the embodiments of the present disclosure, the initial signal line includes the plurality of first signal lines and the plurality of second signal lines. The plurality of first signal lines are coupled to the plurality of second signal lines. The plurality of second signal lines are farther away from the substrate than the plurality of first signal lines, and the orthographic projections of the first electrodes of the plurality of light-emitting devices on the substrate do not overlap with the orthographic projections of the plurality of second signal lines on the substrate. Therefore, the voltage drop of the initial signal transmitted on different first signal lines may be reduced; the voltage drop on the initial signal lines may be reduced, and the uniformity of the initial signal in the display panel may be guaranteed. In addition, the plurality of second signal lines do not affect the planarity of the first electrodes of the plurality of light-emitting devices, which avoids the problem of uneven brightness of the light-emitting devices in the display panel caused by uneven thickness of the first electrodes. As a result, the planarity of the layer where the first electrodes of the light-emitting devices in the display panel are located may be ensured, and the light-emitting effect of the light-emitting devices may be improved.

Figure 6A:
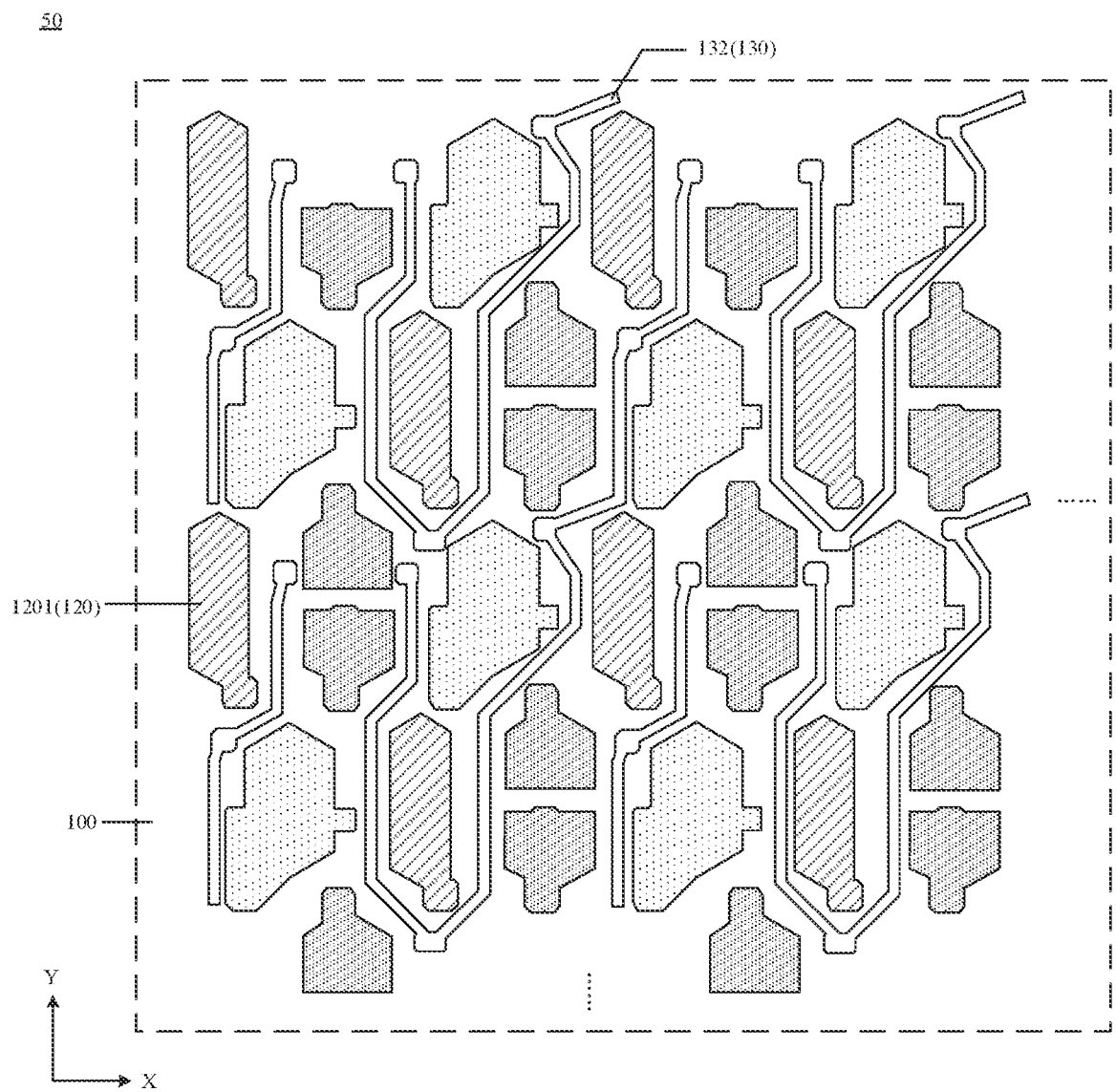
FIG. 6A is a schematic structural diagram of a fourth conductive layer, in accordance with some embodiments.
Figure 6B:
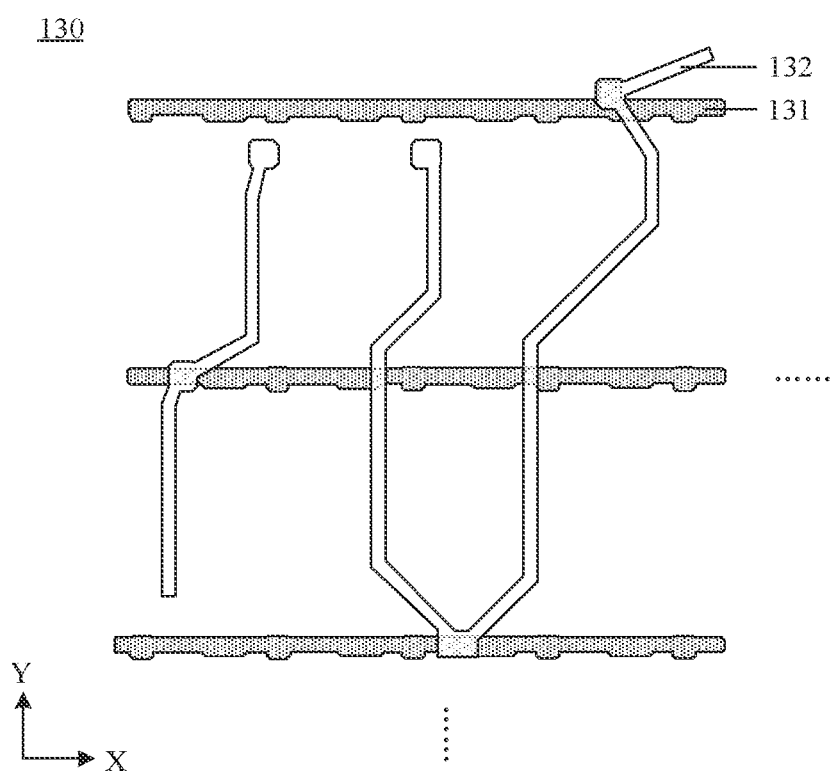
FIG. 6B is a schematic structural diagram of an initial signal line, in accordance with some embodiments.
Figure 6C:
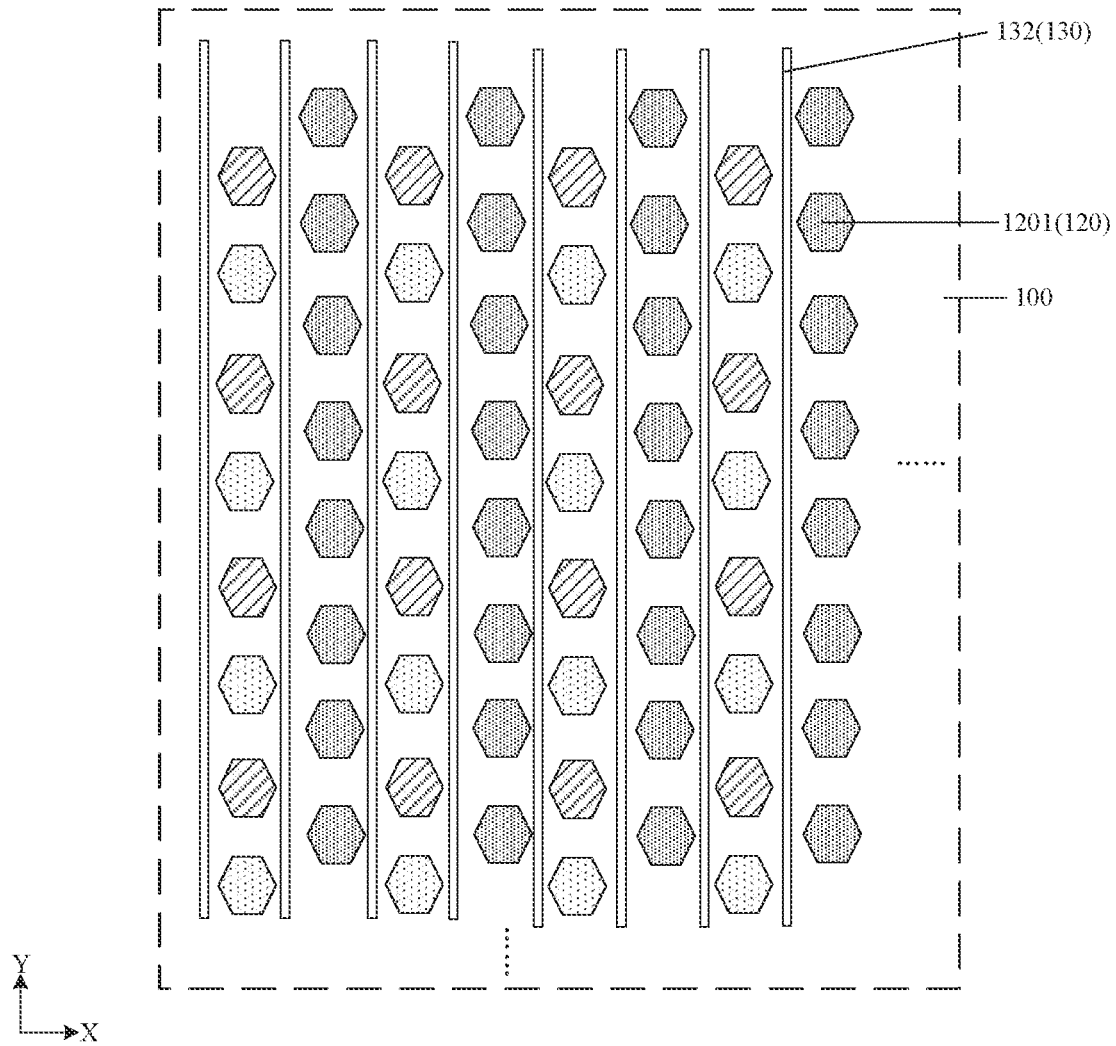
FIG. 6C is a schematic structural diagram of another fourth conductive layer, in accordance with some embodiments.

In some embodiments, the first electrodes of the plurality of light-emitting devices are arranged in the same layer as the plurality of second signal lines. For example, as shown in FIGS. 6A and 6C, the first electrodes 1201 of the light-emitting devices 120 and the plurality of second signal lines 132 are included in a same layer (e.g., a fourth conductive layer 50 shown in FIGS. 6A and 6C) in the display panel 200. For example, the first electrodes of the plurality of light-emitting devices and the plurality of second signal lines are made of a same material. For example, the first electrodes of the plurality of light-emitting devices and the plurality of second signal lines are formed simultaneously, for example, by patterning a same film layer, which simplifies the production process.

It will be noted that since the first electrodes of the plurality of light-emitting devices and the plurality of second signal lines are arranged in the same layer, and the orthographic projections of the first electrodes of the plurality of light-emitting devices on the substrate do not overlap with the orthographic projections of the plurality of second signal lines on the substrate, in the fourth conductive layer, regions other than the plurality of first electrodes may be used for laying the plurality of second signal lines. For example, the plurality of second signal lines are disposed in spaces between adjacent first electrodes of the plurality of first electrodes. For example, a portion of second signal line is located in a space between two adjacent first electrodes.

In some embodiments, an extending direction of a second signal line intersects an extending direction of a first signal line. For example, the extending direction of the first signal line 131 is parallel or approximately parallel to the row direction in which the plurality of pixel circuits 110 are arranged, and the extending direction of the second signal line 132 is not parallel to the extending direction of the first signal line 131. That is, the extending direction of the second signal line 132 is not parallel to the row direction in which the plurality of pixel circuits 110 are arranged.

Figure 6D:
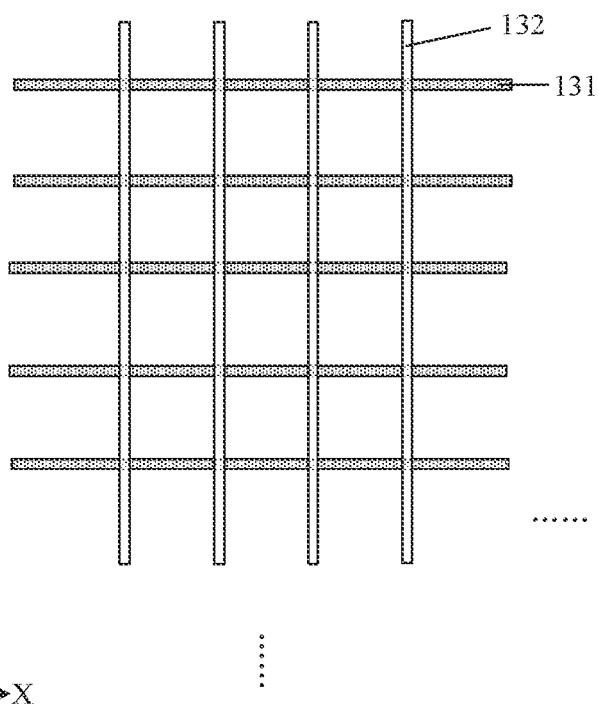
FIG. 6D is a schematic structural diagram of another initial signal line, in accordance with some embodiments.

For example, the extending direction of the second signal line is perpendicular or approximately perpendicular to the extending direction of the first signal line. For example, the extending direction of the second signal line is parallel or approximately parallel to the column direction in which the plurality of pixel circuits are arranged; that is, the extending direction of the second signal line 132 is parallel to the second direction Y in FIG. 6C. Alternatively, for example, an angle between the extending direction of the second signal line and the extending direction of the first signal line is an acute angle or an obtuse angle. For example, referring to FIGS. 6A and 6B, the second signal line 132 may be a polyline. For example, the second signal line has a plurality of line segments connected in sequence, and a connection position of two adjacent line segments may be regarded as a position of a turning point of the second signal line; and an extending direction of each line segment is not parallel to the extending direction of the first signal line. For example, an extending direction of a line segment of a second signal line between two adjacent first electrodes of first electrodes of light-emitting devices corresponding to a row of pixel circuits is perpendicular to the extending direction of the first signal line. For example, the plurality of first signal lines and the plurality of second signal lines in the initial signal line are intersect each other such that the initial signal line has a grid structure. For example, referring to FIGS. 6C and 6D, the plurality of first signal lines 131 extend in the first direction X, the plurality of second signal lines 132 extend in the second direction Y, so that the initial signal line 130 has a grid structure. In this case, the impedance of the initial signal line may be reduced, the difference in the voltages of the initial signals received by the pixel circuits at different positions in the display panel may be avoided, and the uniformity of the initial signal may be improved.

In some embodiments, referring to FIG. 5, one second signal line 132 is coupled to at least two first signal lines 131. For example, one second signal line is coupled to two first signal lines, or, one second signal line is coupled to three or more first signal lines. The at least two first signal lines coupled to the second signal line are not necessarily adjacent. For example, in the case where one second signal line is coupled to two first signal lines, the two first signal lines are adjacent, or the two first signal lines are not adjacent. For example, in the case where one second signal line is coupled to three or more first signal lines, the three or more first signal lines are adjacent first signal lines; or, at least two first signal lines of the three or more first signal lines are adjacent to each other, and at least two first signal lines of the three or more first signal lines are not adjacent; or, none of the three or more first signal lines are adjacent.

For example, at least one first signal line exists between two first signal lines that are not adjacent, and the at least one first signal line is not coupled to the one second signal line. For example, the two first signal lines that are not adjacent are coupled to a same second signal line, and a second signal line coupled to the at least one first signal line located between the two first signal lines that are not adjacent and the second signal line coupled to the two first signal lines that are not adjacent may not be the same second signal line. For example, two adjacent first signal lines in the plurality of first signal lines are coupled to a same second signal line. For example, two adjacent first signal lines in the plurality of first signal lines are coupled to different second signal lines. In this case, through the second signal lines, the impedance of different first signal lines may be reduced, and the impedance of the initial signal line may be reduced. Therefore, the difference in the voltages of the initial signals received by the pixel circuits at different positions in the display panel may be avoided, and the uniformity of the initial signals may be improved.

In some embodiments, in the extending direction of the plurality of first signal lines, at least two second signal lines of second signal lines coupled to a same first signal line are not necessarily adjacent. For example, at least two second signal lines of the second signal lines coupled to the first signal line are adjacent, and at least two signal lines of the second signal lines coupled to the first signal line are not adjacent. For example, the second signal lines coupled to the first signal line are all adjacent, or are all not adjacent. For example, in the row direction in which the plurality of pixel circuits are arranged, the first signal lines coupled to two adjacent second signal lines are not exactly the same. For example, the two adjacent second signal lines are coupled to different first signal lines; or, among the first signal lines coupled to the two adjacent second signal lines, at least one first signal line is the same, and the remaining first signal lines are different; or, the first signal lines coupled to the two adjacent second signal lines are all different; or, the first signal lines coupled to the two adjacent second signal lines are the same. In this case, the two adjacent second signal lines may receive initial signals from different first signal lines, which effectively reduces the voltage drop on the first signal lines, and also reduces the impedance of the initial signal line. Therefore, the difference in the voltages of the initial signals received by the pixel circuits at different positions in the display panel may be avoided, and the uniformity of the initial signals may be improved.

Figure 8:
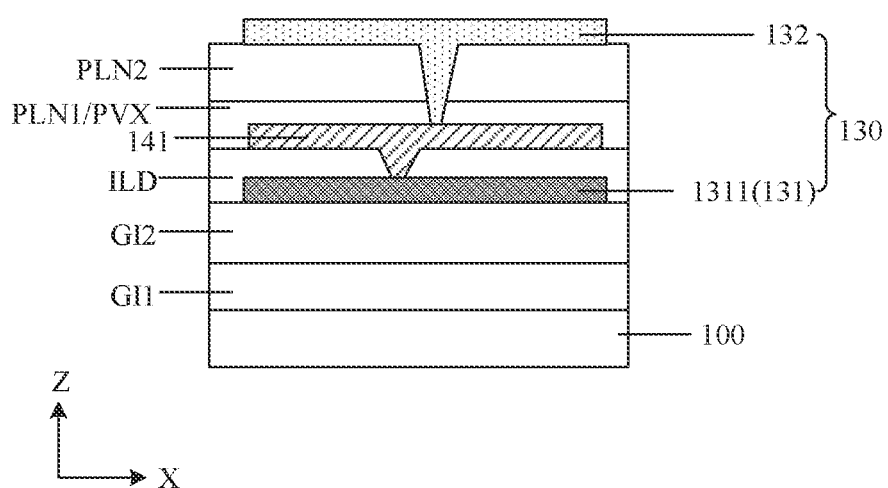
FIG. 8 is a sectional view of the display panel in FIG. 5 taken along the A1-A2 direction.

In some embodiments, as shown in FIG. 5, the display panel 200 further includes a plurality of first conductive patterns 141. The plurality of first conductive patterns 141 are disposed on the substrate 100. Referring to FIG. 8, in a direction perpendicular to the plane where the substrate 100 is located (e.g., a direction Z in FIG. 8), the plurality of first conductive patterns 141 are located between the plurality of first signal lines 131 and the plurality of second signal lines 132. That is, the plurality of first conductive patterns 141 are located on the side of the plurality of first signal lines 131 away from the substrate 100, and are located on a side of the plurality of second signal lines 132 proximate to the substrate 100.

For example, the plurality of first conductive patterns are included in a third conductive layer in the display panel. For example, referring to FIG. 7, the third conductive layer 30 includes the plurality of first conductive patterns 141. For example, the plurality of first signal lines are included in a second conductive layer in the display panel. For example, referring to FIG. 9, the second conductive layer 20 includes the plurality of first signal lines 131. For example, the plurality of second signal lines are included in a fourth conductive layer in the display panel. For example, referring to In FIG. 6A, the fourth conductive layer 50 includes the plurality of second signal lines 132. In the display panel, the third conductive layer is located on a side of the second conductive layer away from the substrate, and the fourth conductive layer is located on a side of the third conductive layer away from the substrate.

Referring to FIGS. 5 and 8, a second signal line 132 is coupled to a first signal line 131 through a first conductive pattern 141. For example, the first conductive pattern is in contact with the first signal line through a via hole provided in a layer (e.g., an insulating layer including an interlayer dielectric layer ILD) interposed between the layer where the first conductive pattern is located (i.e., the third conductive layer) and the layer where the first signal line is located (i.e., the second conductive layer), The second signal line is in contact with the first conductive pattern through a via hole provided in a layer (e.g., an insulating layer including a planarization layer PLN2, and a planarization layer PLN1 or a passivation layer PVX) interposed between the layer where the second signal line is located (i.e., the fourth conductive layer) and the layer where the first conductive pattern is located (i.e., the third conductive layer). For example, the insulating layer between the fourth conductive layer and the third conductive layer may include planarization layer(s), but not include a passivation layer.

In some embodiments, as shown in FIG. 5, in the column direction in which the plurality of pixel circuits 110 are arranged (e.g., the second direction Y), a surface of the first signal line 131 has a protruding portion 1311. Referring to FIG. 8, an orthographic projection of the protruding portion 1311 on the substrate 100 overlaps with an orthographic projection of the first conductive pattern 141 on the substrate 100. For example, an edge of the orthographic projection of the first conductive pattern on the substrate is located within or outside an edge of the orthographic projection of the protruding portion on the substrate; or, the edge of the orthographic projection of the first conductive pattern on the substrate and the edge of the orthographic projection of the protruding portion on the substrate coincide or have a small distance therebetween. In this way, it may be possible to make the surface of the first conductive pattern more uniform and the film layer more planarized. Therefore, the connection effect between the first signal line and the second signal line through the first conductive pattern may be improved, and stable transmission of the initial signal may be ensured.

Figure 7:
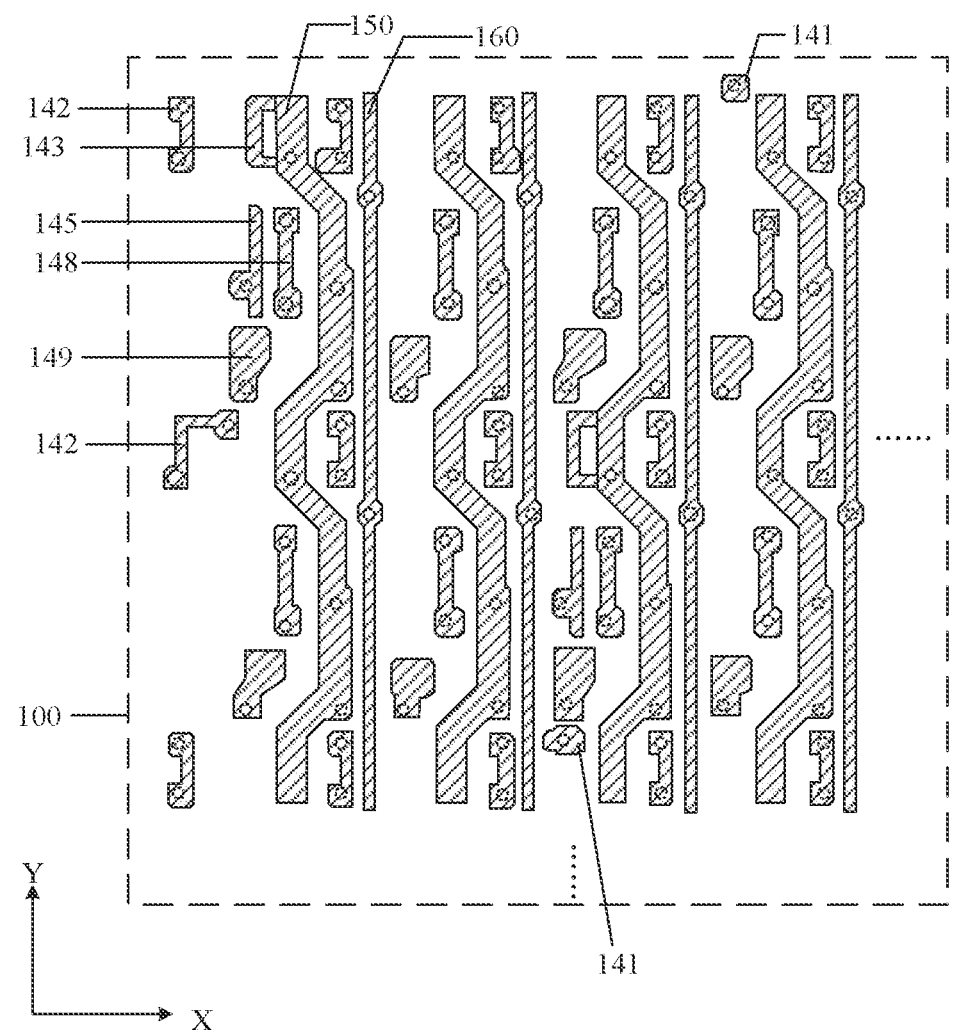
FIG. 7 is a schematic structural diagram of a third conductive layer, in accordance with some embodiments.

In some embodiments, as shown in FIG. 5, the display panel 200 further includes a plurality of second conductive patterns 142. The plurality of second conductive patterns 142 are disposed on the substrate 100. For example, the plurality of second conductive patterns 142 are farther away from the substrate 100 than the plurality of first signal lines 131. For example, the plurality of second conductive patterns are arranged in a same layer as the plurality of first conductive patterns. For example, as shown in FIG. 7, the plurality of second conductive patterns 142 and the plurality of first conductive patterns 141 are all included in the third conductive layer 30. The plurality of second conductive patterns 142 are coupled to the plurality of first signal lines 131. For example, the second conductive pattern is in contact with the first signal line through a via hole provided in a layer (e.g., the insulating layer including the interlayer dielectric layer) interposed between the layer where the second conductive pattern is located (i.e., the third conductive layer) and the layer where the first signal line is located (i.e., the second conductive layer).

Figure 10:
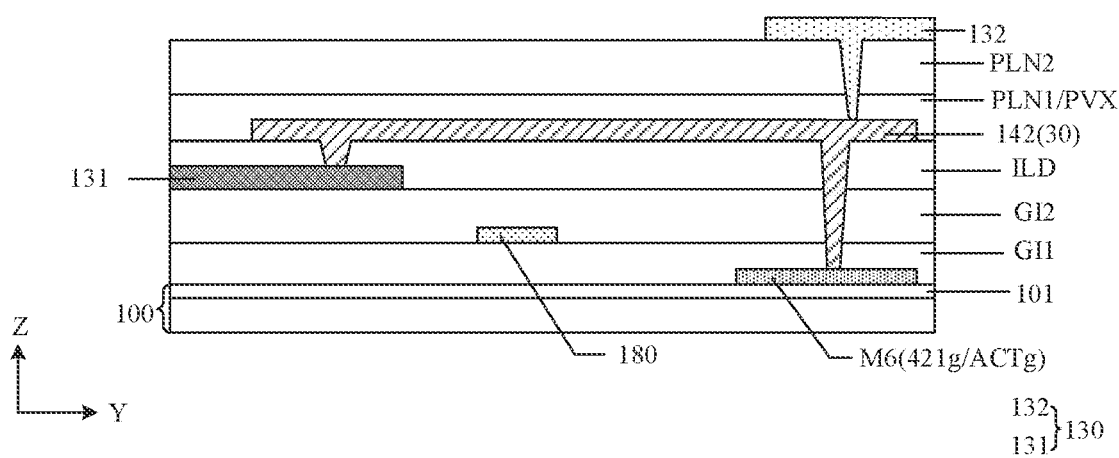
FIG. 10 is a sectional view of the display panel in FIG. 5 taken along the A3-A4 direction.

The pixel circuit 110 includes the first reset transistor M5 and the second reset transistor M6. The first reset transistor M5 and the second reset transistor M6 are each coupled to a second conductive pattern 142. For example, one electrode (e.g., a source or a drain) of the first reset transistor M5 is coupled to the second conductive pattern 142. For example, referring to FIG. 10, one electrode (e.g., a source or a drain) of the second reset transistor M6 is coupled to the second conductive pattern 142. For example, the second conductive pattern 142 is in contact with a first electrode region 421g of an active layer ACTg of the second reset transistor M6 through a via hole. The via hole is provided in a layer (e.g., an insulating layer including gate insulating layer(s) GI and the interlayer dielectric layer ILD) interposed between the layer where the second conductive pattern is located (i.e. the third conductive layer) and a layer where the active layer of the second reset transistor is located (i.e., an active pattern layer).

A second signal line 132 is coupled to one of the first reset transistor M5 and the second reset transistor M6 through a second conductive pattern 142 coupled to the one of the first reset transistor M5 and the second reset transistor MG. For example, the second signal line is coupled to the first reset transistor through the second conductive pattern coupled to the first reset transistor; for example, the second signal line is coupled to one electrode (e.g., the source or the drain) of the first reset transistor. Alternatively, for example, the second signal line is coupled to the second reset transistor through the second conductive pattern coupled to the second reset transistor; for example, the second signal line is coupled to one electrode (e.g., the source or the drain) of the second reset transistor. For example, referring to FIG. 10, the second signal line 132 is coupled to a second conductive pattern 142, the second conductive pattern 142 is further coupled to a first signal line 131, and the second conductive pattern 142 is also in contact with the first electrode region 421g in the active layer ACTg of the second reset transistor M6. In this case, the first signal line 131 is coupled to both the second reset transistor M6 and the second signal line 132 through the second conductive pattern 142.

In some embodiments, as shown in FIG. 5, the display panel 200 further includes at least one third conductive pattern 143. The at least one third conductive pattern 143 is arranged in a same layer as the plurality of second conductive patterns 142. For example, referring to FIG. 7, the at least one third conductive pattern 143 and the plurality of second conductive patterns 142 are all included in the third conductive layer 30. For example, the at least one third conductive pattern and the plurality of second conductive patterns are made of a same material, and the at least one third conductive pattern and the plurality of second conductive patterns may be formed by patterning a same film layer, which simplifies the production process.

As shown in FIG. 5, an orthographic projection of the at least one third conductive pattern 143 on the substrate 100 and an orthographic projection of at least one second conductive pattern 142 of the plurality of second conductive patterns 142 on the substrate 100 both overlap with an orthographic projection of a first electrode of at least one light-emitting device of the plurality of light-emitting devices 120 on the substrate 100. In addition, in the row direction in which the plurality of pixel circuits 110 are arranged, the at least one third conductive pattern 143 and the at least one second conductive pattern 142 are located on two opposite sides of the first electrode 1201 of the at least one light-emitting device 120. For example, an orthographic projection of a single third conductive pattern 143 on the substrate 100 and an orthographic projection of a single second conductive pattern 142 on the substrate 100 both overlap with an orthographic projection of a first electrode 1201 of a single light-emitting device 120 on the substrate 100, and in the row direction in which the plurality of pixel circuits 110 are arranged, the single third conductive pattern 143 and the single second conductive pattern 142 are located on two opposite sides of the first electrode 1201 of the single light-emitting device 120. For example, the light-emitting device may be a light-emitting device of the first color; for example, the light-emitting device is a red light-emitting device. In this case, the planarity of the layer where the first electrode of the light-emitting device is located may be improved, and it may be possible to avoid the display non-uniformity caused by the uneven thickness of the layer of the light-emitting device.

In some embodiments, as shown in FIG. 5, the display panel 200 further includes a plurality of power supply voltage lines 150. The plurality of power supply voltage lines 150 are disposed on substrate 100. The plurality of power supply voltage lines 150 are arranged in a same layer as the at least one third conductive pattern 143. For example, referring to FIG. 7, the plurality of power supply voltage lines 150 and the at least one third conductive pattern 143 are all included in the third conductive layer 30. For example, the plurality of power supply voltage lines and the at least one third conductive pattern are made of a same material, and the plurality of power supply voltage lines and the at least one third conductive pattern may be formed by patterning a same film layer, which simplifies the production process. The at least one third conductive pattern is in contact with at least one power supply voltage line. In this way, the third conductive pattern may receive a power supply voltage transmitted by the power supply voltage line to which the third conductive pattern is coupled, and the voltage of the third conductive pattern is the power supply voltage. For example, the power supply voltage is a DC voltage, such as the DC high level voltage VDD; then, the voltage of the third conductive pattern is also a DC voltage, such as the DC high level voltage VDD. In this way, it may be possible to prevent the third conductive pattern from being in a floating state and thus ensure the stability of the voltage in the pixel circuit.

In some embodiments, as shown in FIG. 5, the display panel 200 further includes at least one fourth conductive pattern 144. The at least one fourth conductive pattern 144 is disposed on the substrate 100. The at least one fourth conductive pattern 144 is closer to the substrate 100 than the plurality of power supply voltage lines 150. For example, the at least one fourth conductive pattern is arranged in a same layer as the first signal lines. For example, referring to FIG. 9, the at least one fourth conductive pattern 144 and the plurality of first signal lines 131 are all included in the second conductive layer 20. For example, the at least one fourth conductive pattern and the plurality of first signal lines are made of a same material, and the at least one fourth conductive pattern and the plurality of first signal lines may be formed by patterning a same film layer, which simplifies the production process.

Figure 11:
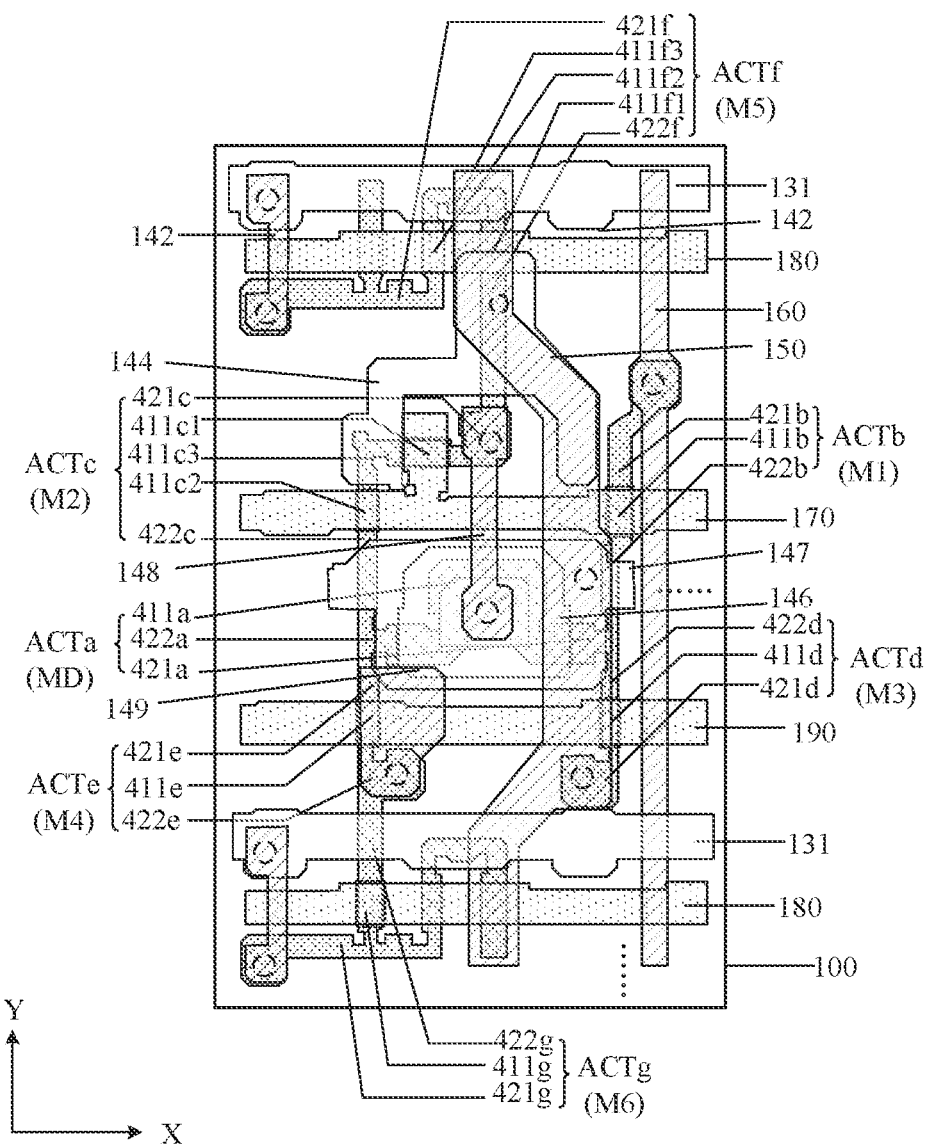
FIG. 11 is a schematic structural diagram of another display panel, in accordance with some embodiments.

Referring to FIG. 11, the at least one fourth conductive pattern 144 is coupled to at least one power supply voltage line 150. For example, one power supply voltage line is coupled to the at least one fourth conductive pattern. In this way, the fourth conductive pattern may receive the power supply voltage transmitted by the power supply voltage line to which the fourth conductive pattern is coupled, and the voltage of the fourth conductive pattern is the power supply voltage. For example, the power supply voltage is a DC voltage, such as the DC high level voltage VDD; then, the voltage of the fourth conductive pattern is also a DC voltage, such as the DC high level voltage VDD.

Referring to FIG. 3, the pixel circuit 110 further includes the driving transistor MD. The driving transistor MD is coupled to the first reset transistor M5. For example, the control electrode of the driving transistor MD is coupled to a second electrode of the first reset transistor M5. In this case, since a first electrode of the first reset transistor is coupled to the initial signal line, the first reset transistor may transmit the initial signal from the initial signal line to the control electrode of the driving transistor, so as to reset the control electrode of the driving transistor and avoid signal interference.

Referring to FIG. 11, an orthographic projection of a fourth conductive pattern 144 on the substrate 100 overlaps with an orthographic projection of the first reset transistor M5 on the substrate 100. For example, the orthographic projection of the fourth conductive pattern 144 on the substrate 100 overlaps with an orthographic projection of one electrode (e.g., the source or the drain) of the first reset transistor M5 on the substrate 100. For example, the orthographic projection of the fourth conductive pattern on the substrate 100 overlaps with a connection point where the first reset transistor and the driving transistor are connected (i.e., a node N in FIG. 3). In this case, since the voltage of the fourth conductive pattern is a DC voltage and the power voltage line transmits a fixed voltage, when the data signal changes, the voltage of the fourth conductive pattern is kept constant, and the fourth conductive pattern may shield the connection point where the first reset transistor and the driving transistor are connected, for example, may shield the node N in FIG. 3. Thus, the voltage of the control electrode of the driving transistor is stabilized. In this way, it may be possible to reduce the influence of the jump of the data signal on the stability of the voltage of the control electrode of the driving transistor, improve the stability of the voltage in the pixel circuit, and ensure the light-emitting effect of the light-emitting device.

In some embodiments, referring to FIG. 3, the pixel circuit 110 further includes the compensation transistor M2. The compensation transistor M2 is coupled to the driving transistor MD and the first reset transistor M5. For example, a first electrode of the compensation transistor M2 is coupled to the control electrode of the driving transistor MD and the second electrode of the first reset transistor M5, and a second electrode of the compensation transistor M2 is coupled to the second electrode of the driving transistor MD. For example, the compensation transistor may write the data signal and the threshold voltage of the driving transistor into the control electrode of the driving transistor, so as to perform threshold voltage compensation on the pixel circuit.

Referring to FIG. 11, the orthographic projection of the fourth conductive pattern 144 on the substrate 100 overlaps with an orthographic projection of the compensation transistor M2 on the substrate 100. For example, the orthographic projection of the fourth conductive pattern 144 on the substrate 100 overlaps with an orthographic projection of a control electrode of the compensation transistor M2 on the substrate 100. In this way, the fourth conductive pattern may stabilize a voltage of the control electrode of the compensation transistor, so as to improve the stability of the voltage in the pixel circuit.

In some embodiments, as shown in FIG. 5, the display panel 200 further includes a plurality of data lines 160. The plurality of data lines 160 are disposed on the substrate 100 and are arranged in a same layer as the plurality of power supply voltage lines 150. For example, referring to FIG. 7, the plurality of data lines 160 and the plurality of power supply voltage lines 150 are all included in the third conductive layer 30. The plurality of data lines and the plurality of power supply voltage lines are made of a same material, and the plurality of data lines and the plurality of power supply voltage lines may be formed by patterning a same film layer, which simplifies the production process. Referring to FIG. 11, the orthographic projection of the at least one fourth conductive pattern 144 on the substrate 100 does not overlap with orthographic projections of the plurality of data lines 160 on the substrate 100. In this way, the fourth conductive pattern and the data line will not create coupling capacitance, and therefore the stability of the voltage in the pixel circuit may be improved.

For example, the data lines 160 extend in a same direction as the power supply voltage lines 150. For example, the data lines 160 extend in the second direction Y shown in FIG. 7. For example, the data lines are configured to transmit data signals, and the pixel circuit drives the light-emitting device to emit light according to the data signal, so that the sub-pixels realize gray-scale display.

In some embodiments, as shown in FIG. 5, the display panel 200 further includes at least one fifth conductive pattern 145. The at least one fifth conductive pattern 145 is disposed on the substrate 100 and arranged in a same layer as the plurality of data lines 160. For example, referring to FIG. 7, the at least one fifth conductive pattern 145 and the plurality of data lines 160 are all included in the third conductive layer 30. The at least one fifth conductive pattern and the plurality of data lines are made of a same material, and the at least one fifth conductive pattern and the plurality of data lines may be formed by patterning a same film layer, which simplifies the production process.

As shown in FIG. 5, an orthographic projection of at least one data line 160 of the plurality of data lines 160 on the substrate 100 and an orthographic projection of the at least one fifth conductive pattern 145 on the substrate 100 both overlap with an orthographic projection of a first electrode of at least one light-emitting device of the plurality of light-emitting devices on the substrate. In addition, in the row direction in which the plurality of pixel circuits 110 are arranged (for example, the first direction X in FIG. 5), the at least one fifth conductive pattern 145 and the at least one data line 160 are located on two opposite sides of the first electrode 1201 of the at least one light-emitting device 120. For example, an orthographic projection of a single fifth conductive pattern 145 on the substrate 100 and an orthographic projection of a single data line 160 on the substrate 100 both overlap with an orthographic projection of a first electrode 1201 of a single light-emitting device 120 on the substrate 100; and in the row direction in which the plurality of pixel circuits 110 are arranged, the single fifth conductive pattern 145 and the single data line 160 are located on two opposite sides of the first electrode 1201 of the single light-emitting device 120. For example, the light-emitting device may be a light-emitting device of the first color; for example, the light-emitting device is a red light-emitting device. In this case, the planarity of the layer where the first electrode of the light-emitting device is located may be improved, and it may be possible to avoid the display non-uniformity caused by the uneven thickness of the layer of the light-emitting device.

In some embodiments, referring to FIG. 5, the display panel 200 further includes a plurality of gate lines 170, a plurality of reset signal lines 180 and a plurality of light-emitting control lines 190, which are disposed on the substrate 100. The plurality of gate lines, the plurality of reset signal lines and the plurality of light-emitting control lines are all arranged in a same layer, made of a same material, and spaced apart from each other. For example, the plurality of gate lines, the plurality of reset signal lines and the plurality of light-emitting control lines are included in the first conductive layer of the display panel. For example, referring to FIG. 12, the plurality of gate lines 170, the plurality of reset signal lines 180 and the plurality of light-emitting control lines 190 are all included in the first conductive layer 10. The first conductive layer is closer to the substrate than the second conductive layer. The plurality of gate lines, the plurality of reset signal lines and the plurality of light-emitting control lines are all closer to the substrate than the plurality of first signal lines. The plurality of gate lines, the plurality of reset signal lines and the plurality of light-emitting control lines extend in a same direction. For example, the plurality of gate lines, the plurality of reset signal lines and the plurality of light-emitting control lines extend in a same direction as the plurality of first signal lines.

Figure 9:
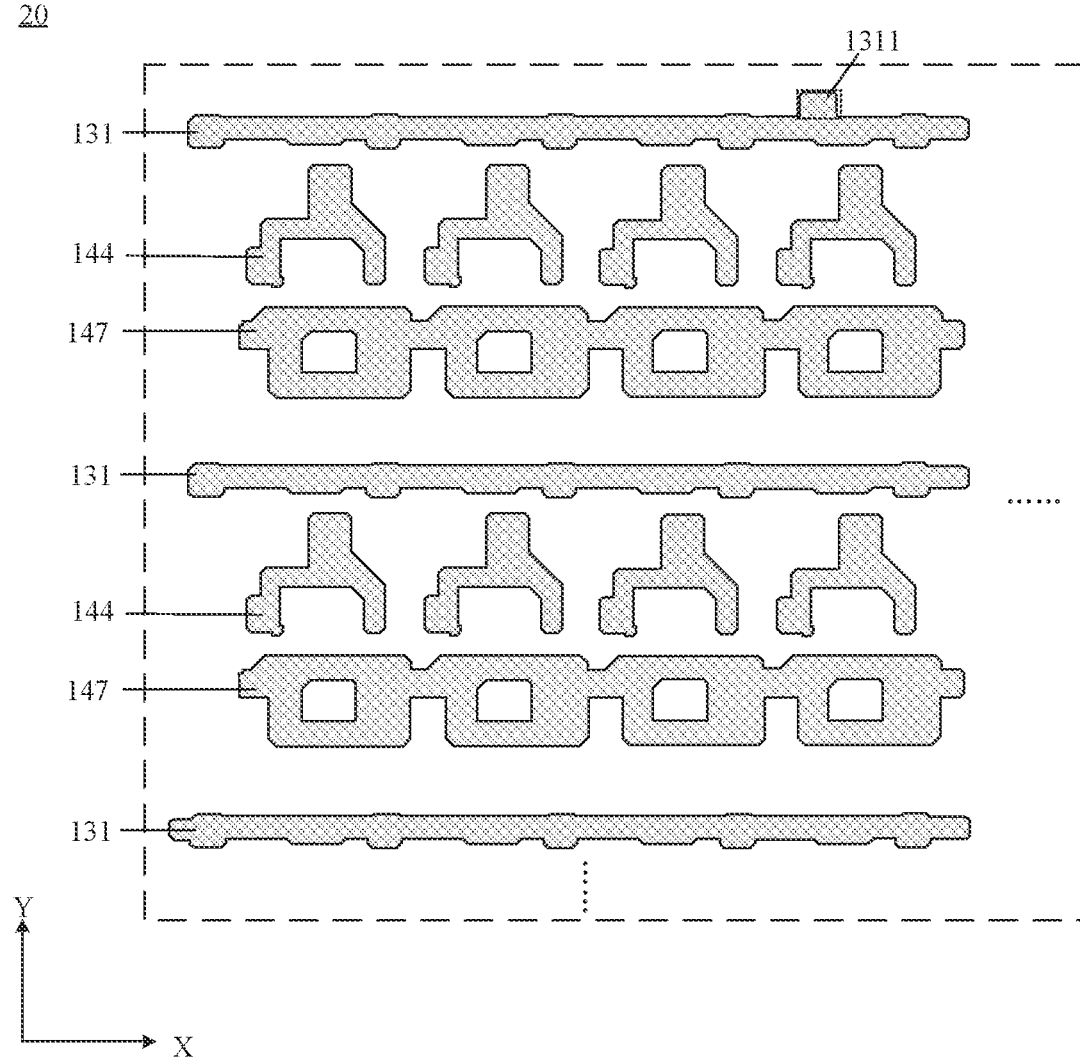
FIG. 9 is a schematic structural diagram of a second conductive layer, in accordance with some embodiments.
Figure 12:
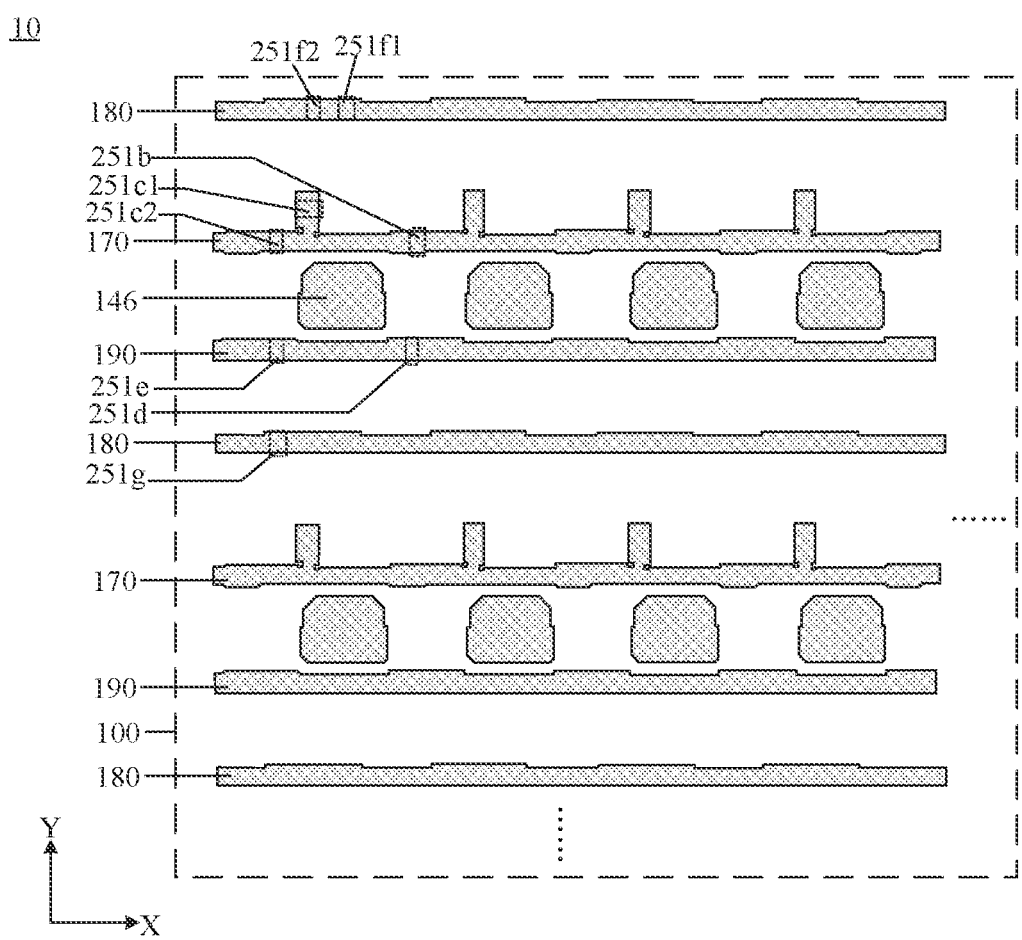
FIG. 12 is a structural diagram of a first conductive layer, in accordance with some embodiments.

For example, referring to FIG. 11, the display panel 200 further includes sixth conductive patterns 146 and seventh conductive patterns 147. The sixth conductive patterns 146 and the gate lines 170 are arranged in a same layer and made of a same material, and may be formed by patterning a same film layer. The seventh conductive patterns 147 and the first signal lines 131 are arranged in a same layer and made of a same material, and may be formed by patterning a same film layer. For example, as shown in FIG. 12, the sixth conductive patterns 146 are included in the first conductive layer 10; as shown in FIG. 9, the seventh conductive patterns 147 are included in the second conductive layer 20. The sixth conductive patterns 146 are located on a side of the seventh conductive patterns 147 proximate to the substrate 100. An orthographic projection of a sixth conductive pattern 146 on the substrate 100 overlaps with an orthographic projection of a seventh conductive pattern 147 on the substrate 100. The sixth conductive pattern 146, the seventh conductive pattern 147 and an insulating layer therebetween constitute a capacitor Cst; for example, the insulating layer includes a gate insulating layer (such as a gate insulating layer GI2 referring to FIG. 10), For example, referring to FIG. 3, the capacitor Cst is included in the pixel circuit 120, and the capacitor Cst is a storage capacitor in the pixel circuit.

For example, the sixth conductive pattern may serve as a first electrode of the capacitor, and the seventh conductive pattern may serve as a second electrode of the capacitor. The capacitor Cst is coupled to the driving transistor MD and the first reset transistor M5, and the capacitor Cst is further coupled to the power supply voltage line 150. For example, the first electrode of the capacitor Cst (i.e., the sixth conductive pattern) is coupled to the power supply voltage line 150, and the second electrode of the capacitor Cst (i.e., the seventh conductive pattern) is coupled to the control electrode of the driving transistor MD and the second electrode of the first reset transistor M5.

For example, seventh conductive patterns in capacitors in the same row of pixel circuits are connected to each other to form an integrated structure. That is, in the row direction in which the plurality of pixel circuits are arranged, adjacent seventh conductive patterns are connected into an integrated structure. The seventh conductive pattern is coupled to the power supply voltage line, and the power supply voltage of the power supply voltage line is transmitted to the seventh conductive pattern; therefore a voltage of the seventh conductive pattern is the power supply voltage, and voltages on seventh conductive patterns connected into an integrated structure are all the power supply voltage. In this way, the impedances of the power supply voltage lines may be reduced, and the resistance-capacitance (RC) load and current-resistance (IR) drop of the power supply voltage may be reduced.

For example, the display panel includes the active pattern layer. The active pattern layer is disposed on the substrate, and is closer to the substrate than the first signal lines, that is, closer to the substrate than the second conductive layer. For example, the active pattern layer is located on a side of the first conductive layer proximate to the substrate. Moreover, the active pattern layer is insulated from the first conductive layer; for example, a gate insulating layer (such as a gate insulating layer GI1 referring to FIG. 10) is provided between the active pattern layer and the first conductive layer.

For example, the active pattern layer includes a semiconductor pattern and a conductor pattern. For example, a semiconductor material film is formed on the substrate, and a treatment, for example, ion doping, is performed on a portion of the semiconductor material film to alter its conducting properties, so as to obtain the conductor pattern; then, a portion of the semiconductor material film which is not subjected to the treatment is the semiconductor pattern. For example, each transistor in the pixel circuit includes an active layer, the active layer includes a channel region, a first electrode region and a second electrode region, and the first electrode region and the second electrode region are respectively located at two sides of the channel region. For example, one of the first electrode region and the second electrode region is a source region, and the other is a drain region. It will be understood that the semiconductor pattern includes the channel region of the active layer, and the conductor pattern includes the first electrode region and the second electrode region of the active layer. For a transistor, a portion of the active layer thereof corresponding to the first electrode region may be used as one of a source and a drain (e.g., the source), and a portion of the active layer thereof corresponding to the second electrode region may be used as the other of the source and the drain (e.g., the drain).

Figure 13:
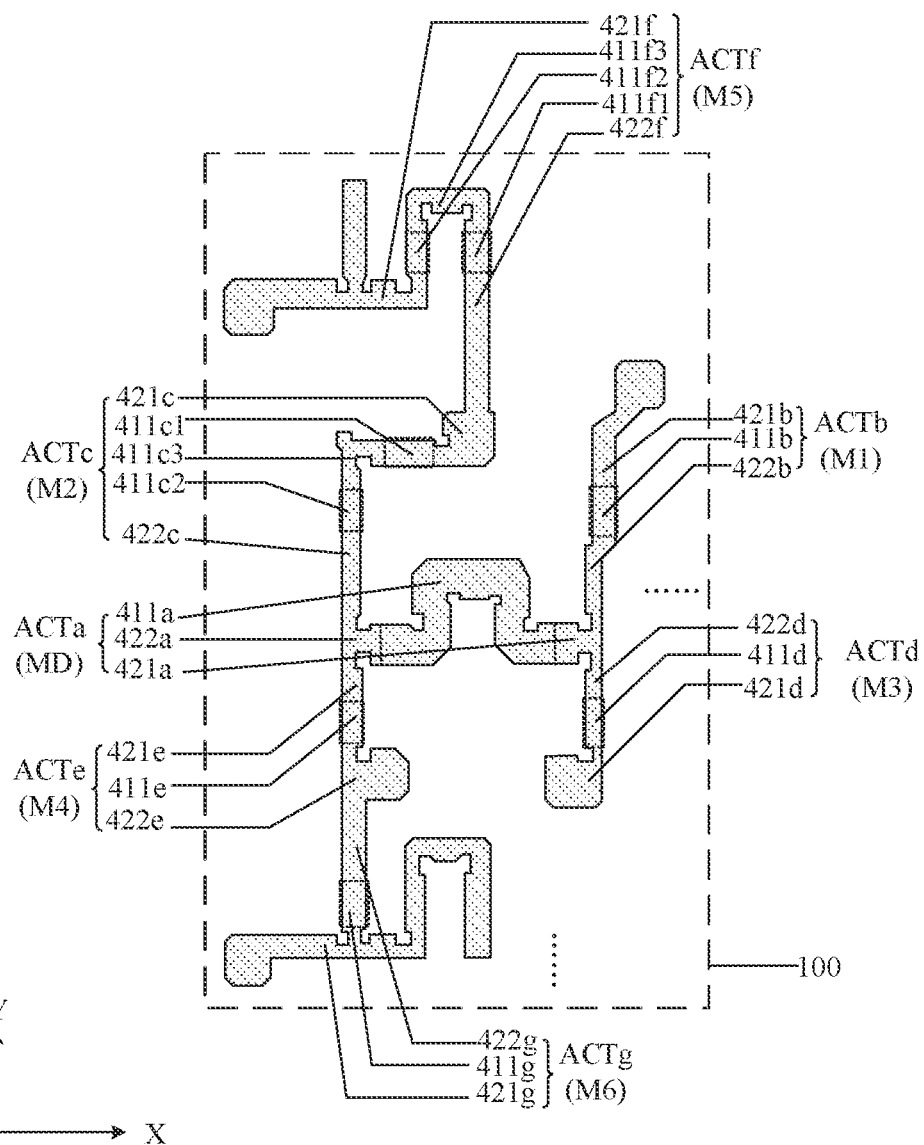
FIG. 13 is a schematic structural diagram of an active pattern layer, in accordance with some embodiments.
Figure 14:
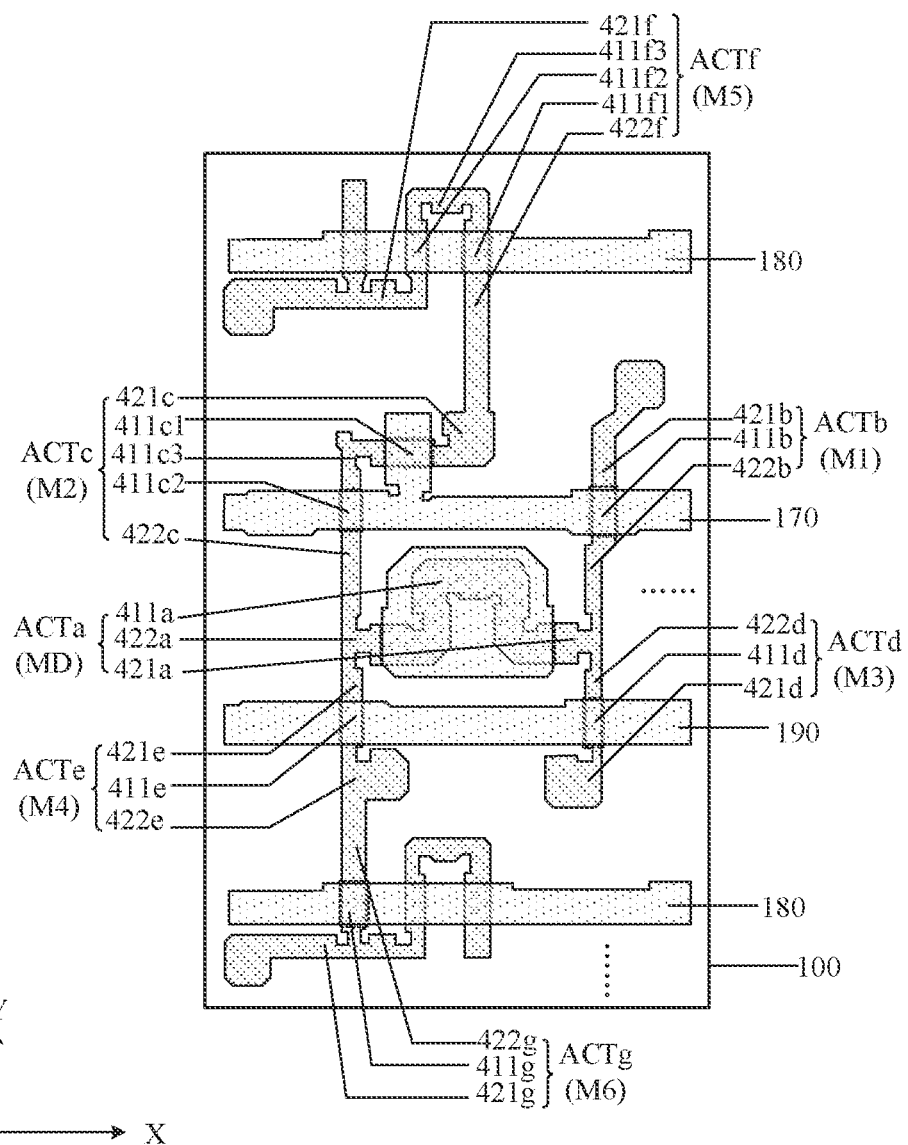
FIG. 14 is a schematic structural diagram of another display panel, in accordance with some embodiments.

For example, referring to FIGS. 12 to 14, an orthographic projection of a portion of the active pattern layer 40 on the substrate 100 overlaps with an orthographic projection of a sixth conductive pattern 146 in the first conductive layer 10 on the substrate 100, and the portion of the active pattern layer 40 is used as a channel region 411*a* of an active layer ACTa of the driving transistor MD in the pixel circuit. A portion of the sixth conductive pattern 146 corresponding to the channel region 411*a* of the active layer ACTa of the driving transistor serves as the control electrode (i.e., the gate) 251*a* of the driving transistor. For example, orthographic projections of portions of the active pattern layer 40 on the substrate 100 overlap with an orthographic projection of a gate line 170 in the first conductive layer 10 on the substrate 100, and the portions of the active pattern layer 40 are used as a channel region 411*b* in an active layer ACTb of the writing transistor M1 in the pixel circuit and channel regions 411*c*1 and 411*c*2 of the active layer ACTc of the compensation transistor M2 in the pixel circuit. A second electrode region 422*b* of the active layer 411*b* of the writing transistor M1 is connected to a first electrode region 421*a* of the active layer ACTa of the driving transistor MD, and a second electrode region 422*c* of the active layer ACTc of the compensation transistor M2 is connected to a second electrode region 422*a* of the active layer ACTa of the driving transistor.

For example, referring to FIG. 11, the display panel 200 further includes eighth conductive patterns 148 disposed on the substrate 100. As shown in FIG. 7, the eighth conductive patterns 148 are included in the third conductive layer 30. A first electrode region 421*c* of the active layer ACTc of the compensation transistor M2 is coupled to an eighth conductive pattern 148. For example, the eighth conductive pattern 148 is in contact with the first electrode region 421*c* of the active layer ACTc of the compensation transistor M2 through a via hole provided in a layer (e.g., including the interlayer dielectric layer and the gate insulating layer(s)) interposed therebetween. For example, a portion of the gate line 170 corresponding to the channel region 411*b* of the active layer ACTb of the writing transistor M1 may serve as a control electrode (i.e., a gate) 251*b* of the writing transistor M1. For example, the active layer ACTc of the writing transistor M1 includes channel regions 411*c*1, 411*c*2 and 411*c*3. Portions of the gate line 170 corresponding to the channel regions 411*c*1 and 411*c*2 of the active layer ACTc of the compensation transistor M2 may serve as control electrodes (i.e., gates) 251*c*1 and 251*c*2 of the compensation transistor M2. That is, the compensation transistor has a double gate structure, which may avoid a leakage current. For example, the first electrode region of the active layer of the writing transistor is coupled to a data line. For example, the data line 160 is in contact with the first electrode region 421*b* of the active layer ACTb of the writing transistor through a via hole provided in a layer (e.g., including the interlayer dielectric layer and the gate insulating layer(s)) interposed therebetween.

For example, referring to FIG. 3, the pixel circuit 110 further includes the first light-emitting control transistor M3 and the second light-emitting control transistor M4. Referring to FIGS. 12 to 14, orthographic projections of portions of the active pattern layer 40 on the substrate 100 overlap with an orthographic projection of a light-emitting control line 190 in the first conductive layer 10 on the substrate 100, and the portions of the active pattern layer 40 are used as a channel region 411d of an active layer ACTd of the first light-emitting control transistor M3 and a channel region 411e of an active layer ACTe of the second light-emitting control transistor M4. For example, a portion of the light-emitting control line 190 corresponding to the channel region 411d of the active layer ACTd of the first light-emitting control transistor M3 may serve as a control electrode 251d of the first light-emitting control transistor M3, and a portion of the light-emitting control line 190 corresponding to the channel region 411e of the active layer of the second light-emitting control transistor M4 may serve as a control electrode 251e of the second light-emitting control transistor M4. A second electrode region 422d of the active layer ACTd of the first light-emitting control transistor M3 is connected to both the first electrode region 421a of the active layer ACTa of the driving transistor DT and the second electrode region 422b of the active layer ACTb of the writing transistor M1 with no gap therebetween. For example, the active layer ACTd of the first light-emitting control transistor M1, the active layer ACTa of the driving transistor MD, and the active layer ACTb of the writing transistor M1 are connected into an integrated structure. A first electrode region 421e of the active layer ACTe of the second light-emitting control transistor M4 is connected to both the second electrode region 422a of the active layer ACTa of the driving transistor MD and the second electrode region 422c of the active layer ACTc of the compensation transistor M2 with no gap therebetween. For example, the active layer ACTe of the second light-emitting control transistor M4, the active layer ACTa of the driving transistor MD and the active layer ACTc of the compensation transistor M2 are connected into an integrated structure.

For example, referring to FIG. 11, a first electrode region 421d of the active layer ACTd of the first light-emitting control transistor M3 is coupled to the power supply voltage line 150. For example, the power supply voltage line 150 is in contact with the first electrode region 421d of the active layer ACTd of the first light-emitting control transistor M3 through a via hole provided in a layer (e.g., including the interlayer dielectric layer and the gate insulating layer(s)) interposed therebetween. Moreover, the second electrode (i.e., the seventh conductive pattern) of the capacitor is coupled to the power supply voltage line. For example, referring to FIG. 11 the power supply voltage line 150 is in contact with the seventh conductive pattern 147 through a via hole provided in a layer (e.g., including the interlayer dielectric layer) interposed therebetween.

For example, referring to FIG. 11, the display panel 200 further includes ninth conductive patterns 149 disposed on the substrate 100. For example, as shown in FIG. 7, the ninth conductive patterns 149 are included in the third conductive layer 30. Referring to FIGS. 12 to 14, a ninth conductive pattern 149 is coupled to a second electrode region 422e of the active layer ACTe of the second light-emitting control transistor M4. For example, the ninth conductive pattern 149 is in contact with the second electrode region 422e of the active layer ACTe of the second light-emitting control transistor M4 through a via hole provided in a layer (e.g., including the interlayer dielectric layer and the gate insulating layer(s)) interposed therebetween. For example, the ninth conductive pattern is used for coupling with the light-emitting device. For example, the ninth conductive pattern is coupled to the first electrode of the light-emitting device, and the second light-emitting control transistor is coupled to the light-emitting device. For example, referring to FIG. 10, the planarization layer PLN2 is provided on a side of the third conductive layer 30 away from the substrate 100, and the passivation layer PVX or the planarization layer PLN1 is provided on a side of the planarization layer PLN2 proximate to the substrate 100 and on the side of the third conductive layer 30 away from the substrate 100. For example, the planarization layers are made of an organic material including polyimide, and the passivation layer is made of an inorganic material including silicon nitride. The first electrode of the light-emitting device is in contact with the ninth conductive pattern through a via hole provided in the planarization layer(s) and the passivation layer.

For example, referring to FIGS. 12 to 14, orthographic projections of portions of the active pattern layer 40 on the substrate 100 overlap with an orthographic projection of a reset signal line 180 in the first conductive layer 10 on the substrate 100, and the portions of the active pattern layer 40 serve as channel regions 411f/1 and 411f/2 of an active layer ACTf of the first reset transistor M5; an orthographic projection of a portion of the active pattern layer 40 on the substrate 100 overlaps with an orthographic projection of another reset signal line 180 in the first conductive layer 10 on the substrate 100, and the portion of the active pattern layer 40 serves as a channel region 411g of the active layer ACTg of the second reset transistor M6. For example, portions of the reset signal line 180 corresponding to the channel regions 411f/1 and 411f/2 of the active layer ACTf of the first reset transistor M5 may serve as control electrodes 251f/1 and 251f/2 of the first reset transistor M5; that is, the first reset transistor has a double gate structure, which may avoid the generation of leakage current. A portion of the another reset signal line 180 corresponding to the channel region 411g of the active layer ACTg of the second reset transistor M6 may serve as a control electrode 251g of the second reset transistor M6. A second electrode region 422f of the active layer ACTf of the first reset transistor M5 is connected to the first electrode region 421c of the active layer ACTc of the compensation transistor M2; that s, the second electrode region 422f of the active layer ACTf of the first reset transistor M5 is coupled to the eighth conductive pattern 148 and thus coupled to the sixth conductive pattern 146; that is, the second electrode region 422f of the active layer ACTf of the first reset transistor M5 is coupled to the control electrode 251a of the driving transistor MD. A second electrode region 422g of the active layer ACTg of the second reset transistor M6 is connected to the second electrode region 422e of the active layer ACTe of the second light-emitting control transistor M4; that is, the second electrode region 422g of the active layer ACTg of the second reset transistor M6 is coupled to the ninth conductive pattern 149. For example, the second electrode region 422g of the active layer ACTg of the second reset transistor M6 is coupled to the light-emitting device.

For example, the reset signal line corresponding to the first reset transistor and the reset signal line corresponding to the second reset transistor may transmit a same signal. For example, a single row of pixel circuits correspond to a single reset signal line; that is, a single row of pixel circuits are coupled to a single reset signal line. In this way, the first reset transistor and the second reset transistor are turned on simultaneously, so that the driving transistor and the light-emitting device are reset in a same time period.

For example, the reset signal line corresponding to the first reset transistor and the reset signal line corresponding to the second reset transistor may transmit different signals;

that is, the first reset transistor and the second reset transistor receive different reset signals. For example, referring to FIG. 3, the first reset transistor M5 receives the reset signal Reset, and the second reset transistor M6 receives the reset signal Reset'. For example, a single row of pixel circuits may be coupled to two different reset signal lines. For example, a reset signal line coupled to first reset transistors in a row of pixel circuits transmits a same signal as a gate line coupled to a previous row of pixel circuits previous to the row of pixel circuits, and another reset signal line coupled to second reset transistors in the row of pixel circuits transmits a same signal as a gate line coupled to the row of pixel circuits. In this case, the reset signal line coupled to the row of pixel circuits is also used as the gate line coupled to the previous row of pixel circuits, and the another reset signal line coupled to the row of pixel circuits is also used as the gate line coupled to the row of pixel circuits.

In this case, in response to a reset signal from the reset signal line coupled to a first reset transistor in each pixel circuit in the row of pixel circuits, the first reset transistor is turned on and transmits the initial signal from the initial signal line to a control electrode of a driving transistor in the pixel circuit in the row of pixel circuits, so as to reset the driving transistor. At the same time, in response to a gate driving signal from the gate line coupled to a writing transistor and a compensation transistor in each pixel circuit in the previous row of pixel circuits previous to the row of pixel circuits, the writing transistor and the compensation transistor are turned on, and write a threshold voltage of a driving transistor in the pixel circuit in the previous row of pixel circuits and the data signal into a control electrode of the driving transistor. In response to a reset signal from the reset signal line coupled to a second reset transistor in the pixel circuit in the row of pixel circuits, the second reset transistor is turned on and resets a light-emitting device. At the same time, in response to a gate driving signal from the gate line coupled to a writing transistor and a compensation transistor in the pixel circuit in the row of pixel circuits, the writing transistor and the compensation transistor are turned on, and write a threshold voltage of a driving transistor in the pixel circuit in the row of pixel circuits and the data signal into a control electrode of the driving transistor.

For example, the material of the active layer of each transistor in the active pattern layer includes amorphous silicon, polycrystalline silicon or an organic semiconductor material. All structures in the first conductive layer (for example, including the sixth conductive patterns, the gate lines, the light-emitting control lines, and the reset signal lines), all structures in the second conductive layer (for example, including the fourth conductive patterns, the seventh conductive patterns, and the first signal lines), and all structures in the third conductive layer (for example, including the first conductive patterns, the second conductive patterns, the third conductive patterns, the fifth conductive patterns, the data lines, and the power supply voltage lines) may each be a single-layer structure or a multi-stacked layer structure, and the material of single-layer structure or multi-stacked layer structure includes at least one of aluminum (Al), silver (Ag), magnesium (Mg), molybdenum (Mo), titanium (Ti), copper (Cu) and other metals.

For example, the embodiments of the present disclosure do not limit the type of the transistor, which can be designed according to actual situations. For example, the transistors adopted in the embodiments of the present disclosure may be P-type transistors or N-type transistors, and may be bottom-gate transistors or top-gate transistors. For example, the transistors adopted in the embodiments of the present disclosure may be thin film transistors, field effect transistors (FETs), or other switching devices with the same properties, which is not limited in the embodiments of the present disclosure. For example, the adopted transistors may include metal oxide thin film transistors (for example, thin film transistors whose active patterns are made of indium gallium zinc oxide (IGZO)) and low temperature polysilicon thin film transistors (for example, thin film transistors whose active patterns are made of polysilicon (P-Si)).

For example, the display panel includes a light shielding layer. The light shielding layer is disposed on the substrate. For example, the buffer layer and the light shielding layer are included in the substrate. The light shielding layer is farther away from the active pattern layer than the buffer layer; that is, the buffer layer is located between the light shielding layer and the active pattern layer. For example, referring to FIG. 10, the light shielding layer 101 is located on a side of the active layer of the transistor (e.g., the active layer ACTg of the second reset transistor M6 in FIG. 10) away from the first signal line 131. For example, the plurality of second signal lines are included in the light shielding layer; that is, the plurality of second signal lines are located on the side of the plurality of first signal lines proximate to the substrate. The plurality of second signal lines are coupled to the plurality of first signal lines. As for the positions where the plurality of second signal lines are coupled to the plurality of first signal lines, reference may be made to the above description, and details will not be repeated here. For example, the buffer layer may be a single-layer structure or a multi-layer structure; and the buffer layer may be made of an inorganic material, such as silicon oxide ($SiO_x$) or silicon nitride ($SiN_x$).

For example, orthographic projections of the plurality of second signal lines in the light shielding layer on the buffer layer overlap with an orthographic projection of the active pattern layer on the buffer layer. For example, the orthographic projections of the plurality of second signal lines in the light shielding layer on the buffer layer cover the orthographic projection of the active pattern layer on the buffer layer; that is, the orthographic projection of the active pattern layer on the buffer layer may be located within the orthographic projections of the plurality of second signal lines in the light shielding layer on the buffer layer. Therefore, the plurality of second signal lines in the light shielding layer may shield the active pattern layer, and light incident from a side of the light shielding layer away from the active pattern layer may be blocked by the light shielding layer and will not be irradiated on the active pattern layer. In this way, it may be possible to prevent the irradiation of light from causing significant changes in the properties of the active pattern layer, avoid fluctuations in the properties of the transistors in the display panel, and thus improve the stability of the display panel.

For example, the plurality of second signal lines may be located between the plurality of first signal lines and the first electrodes of the plurality of light-emitting devices. For example, the second signal lines are included in a fifth conductive layer of the display panel. The fifth conductive layer is located between the third conductive layer and the fourth conductive layer. For example, the fifth conductive layer is located between the planarization layer PLN1 and the planarization layer PLN2 (referring to FIG. 8); that is, the planarization layer PLN1 is located between the third conductive layer and the fifth conductive layer, and the planarization layer PLN2 is located between the fifth conductive layer and the fourth conductive layer.

For example, the power supply voltage lines are included in the third conductive layer, and the second signal lines are farther away from the substrate than the power supply voltage lines. For example, the orthographic projection of the second signal line on the substrate is located within the orthographic projection of the power supply voltage line on the substrate. For example, the shape of the orthographic projection of the second signal line on the substrate is the same or approximately the same as the shape of the orthographic projection of the power supply voltage line 150 on the substrate 100 (referring to FIG. 7). For example, an outer edge of the orthographic projection of the second signal line on the substrate is located within an outer edge of the orthographic projection of the power supply voltage line on the substrate; or, the outer edge of the orthographic projection of the second signal line on the substrate coincides with the outer edge of the orthographic projection of the power supply voltage line on the substrate. For example, a width of the second signal line is equal to or approximately equal to a width of the power supply voltage line. For example, the second signal lines extend in a same direction as the power supply voltage lines. The plurality of second signal lines are coupled to the plurality of first signal lines. In this way, the impedances of the first signal lines may be reduced, and the impedance of the initial signal line may be reduced; in addition, the second signal lines are located within a range of the power supply voltage lines, and thus will not affect the transmittance of the display panel. As for the positions where the plurality of second signal lines are coupled to the plurality of first signal lines, reference may be made to the above description, and details will not be repeated here.

For example, the data lines are located in the fifth conductive layer; that is, the fifth conductive layer includes the second signal lines and the data lines. For example, referring to FIG. 7, there is a gap between the orthographic projection of the data line 160 on the substrate 100 and the orthographic projection of the power supply voltage line 150 on the substrate 100; and one power supply voltage line 150 may be located between two adjacent data lines 160, Since the orthographic projection of the second signal line on the substrate is located within the orthographic projection of the power supply voltage line on the substrate, a position of the second signal line corresponds to a position of the power supply voltage line. Therefore, a second signal line exists between two adjacent data lines. The second signal lines are coupled to the first signal lines, so that signals transmitted on the second signal lines are initial signals, fixed-level signals, so as to shield the interference signals on the data lines.

For example, among the plurality of data lines and the plurality of second signal lines in the fifth conductive layer, the width of the second signal line is equal to or approximately equal to a width of the data line. For example, in the row direction in which the pixel circuits are arranged, a distance between proximate edges of the orthographic projection of the second signal line on the substrate and the orthographic projection of the data line on the substrate are larger than a distance between proximate edges of the orthographic projection of the power supply voltage line on the substrate and the orthographic projection of the data line on the substrate. That is, the edge of the orthographic projection of the second signal line on the substrate is located within the edge of the orthographic projection of the power supply voltage line on the substrate. In this way, the distance between the second signal line and the data line may be increased, and the load on the data line may be reduced.

For example, in the fifth conductive layer, in the row direction in which the pixel circuits are arranged, a distance between a data line and an adjacent second signal line is equal; that is, in the row direction in which the pixel circuits are arranged, the plurality of data lines and the plurality of first signal lines are sequentially arranged at equal intervals. In this way, a layer located on a side of the fifth conductive layer away from the substrate is relatively planarized. For example, referring to FIG. 8, a surface of the planarization layer PLN2 proximate to the substrate 100 and a surface of the planarization layer PLN2 away from the substrate 100 are planarized (that is, there is no step difference or approximately no step difference of the surfaces of the planarization layer PLN2). In this way, the fourth conductive layer on a side of the planarization layer PLN2 away from the substrate is also relatively planarized, which improves the planarity of the layer where the first electrodes of the light-emitting devices are located. As a result, the light-emitting effect of the light-emitting devices may be improved, and the display effect of the display panel may be improved.

For example, the first electrodes of the light-emitting devices may correspond to second signal lines and data lines of an equal number. For example, an orthographic projection of a first electrode of a single light-emitting device on the substrate overlaps with both an orthographic projection of a single second signal line on the substrate and an orthographic projection of a single data line on the substrate. In this way, the layer where the first electrodes of the light-emitting devices are located may be more uniform, and the planarity of the layer where the first electrodes of the light-emitting devices are located may be improved. As a result, the light-emitting effect of the light-emitting devices may be improved, and the display effect of the display panel may be improved.

In addition, the beneficial effects of the display device are the same as those of the display panel, and details will not be repeated here.

The foregoing descriptions are merely specific implementations of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a substrate;
   a plurality of pixel circuits disposed on the substrate;
   an initial signal line disposed on the substrate, wherein the initial signal line is coupled to the plurality of pixel circuits, the initial signal line includes a plurality of first signal lines and a plurality of second signal lines, the plurality of second signal lines are farther away from the substrate than the plurality of first signal lines, and the plurality of first signal lines are coupled to the plurality of second signal lines;
   a plurality of light-emitting devices disposed on the substrate, wherein each light-emitting device of the plurality of light-emitting devices is coupled to a pixel circuit of the plurality of pixel circuits, the light-emitting device includes a first electrode, and orthographic projections of first electrodes of the plurality of light-emitting devices on the substrate do not overlap with orthographic projections of the plurality of second signal lines on the substrate;

a plurality of second conductive patterns disposed on the substrate, the plurality of second conductive patterns being coupled to the plurality of first signal lines, wherein the pixel circuit includes a first reset transistor and a second reset transistor; the first reset transistor and the second reset transistor are each coupled to a second conductive pattern; and a second signal line of the plurality of second signal lines is coupled to one of the first reset transistor and the second reset transistor through a second conductive pattern coupled to the one of the first reset transistor and the second reset transistor; and at least one third conductive pattern arranged in a same layer as the plurality of second conductive patterns, wherein an orthographic projection of the at least one third conductive pattern on the substrate and an orthographic projection of at least one second conductive pattern of the plurality of second conductive patterns on the substrate both overlap with an orthographic projection of a first electrode of a light-emitting device of at least one light-emitting device of the plurality of light-emitting devices on the substrate; and in a row direction in which the plurality of pixel circuits are arranged, the at least one third conductive pattern and the at least one second conductive pattern are located on two opposite sides of the first electrode of the light-emitting device of the at least one light-emitting device.

2. The display panel according to claim 1, wherein the first electrodes of the plurality of light-emitting devices are arranged in a same layer as the plurality of second signal lines.

3. The display panel according to claim 1, wherein an extending direction of a second signal line of the plurality of second signal lines intersects an extending direction of a first signal line of the plurality of first signal lines.

4. The display panel according to claim 1, wherein a second signal line of the plurality of second signal lines is coupled to at least two first signal lines of the plurality of first signal lines, and the at least two first signal lines are not necessarily adjacent.

5. The display panel according to claim 1, wherein in an extending direction of the plurality of first signal lines, at least two second signal lines of the plurality of second signal lines coupled to a same first signal line are not necessarily adjacent.

6. The display panel according to claim 1, further comprising a plurality of first conductive patterns disposed on the substrate, wherein in a direction perpendicular to a plane where the substrate is located, the plurality of first conductive patterns are located between the plurality of first signal lines and the plurality of second signal lines; and a second signal line of the plurality of second signal lines is coupled to a first signal line of the plurality of first signal lines through a first conductive pattern of the plurality of first conductive patterns.

7. The display panel according to claim 6, wherein in a column direction in which the plurality of pixel circuits are arranged, a surface of the first signal line has a protruding portion; and an orthographic projection of the protruding portion on the substrate overlaps with an orthographic projection of the first conductive pattern on the substrate.

8. The display panel according to claim 1, further comprising a plurality of power supply voltage lines disposed on the substrate, wherein the plurality of power supply voltage lines are arranged in a same layer as the at least one third conductive pattern, and the at least one third conductive pattern is in contact with at least one power supply voltage line of the plurality of power supply voltage lines.

9. The display panel according to claim 8, further comprising at least one fourth conductive pattern disposed on the substrate, wherein the at least one fourth conductive pattern is arranged in a same layer as the plurality of first signal lines, and the at least one fourth conductive pattern is coupled to one or more power supply voltage lines of the plurality of power supply voltage lines;

the pixel circuit further includes a driving transistor, and the driving transistor is coupled to the first reset transistor; and an orthographic projection of a fourth conductive pattern of the at least one fourth conductive pattern on the substrate overlaps with an orthographic projection of the first reset transistor on the substrate.

10. The display panel according to claim 9, wherein the pixel circuit further includes a compensation transistor; the compensation transistor is coupled to the driving transistor and the first reset transistor; and the orthographic projection of the fourth conductive pattern on the substrate further overlaps with an orthographic projection of the compensation transistor on the substrate.

11. The display panel according to claim 9, further comprising a plurality of data lines, wherein the plurality of data lines are disposed on the substrate and arranged in a same layer as the plurality of power supply voltage lines; and an orthographic projection of the at least one fourth conductive pattern on the substrate does not overlap with orthographic projections of the plurality of data lines on the substrate.

12. The display panel according to claim 11, further comprising at least one fifth conductive pattern, wherein the at least one fifth conductive pattern is disposed on the substrate and arranged in a same layer as the plurality of data lines;

an orthographic projection of at least one data line of the plurality of data lines on the substrate and an orthographic projection of the at least one fifth conductive pattern on the substrate both overlap with an orthographic projection of a first electrode of a light-emitting device of one or more light-emitting devices of the plurality of light-emitting devices on the substrate; and in a row direction in which the plurality of pixel circuits are arranged, the at least one fifth conductive pattern and the at least one data line are located on two opposite sides of the first electrode of the light-emitting device of the one or more light-emitting devices.

13. A display device, comprising:

the display panel according to claim 1; and a driving chip coupled to the display panel, wherein the driving chip is configured to provide signals to the display panel.

14. The display panel according to claim 10, further comprising a plurality of data lines, wherein the plurality of data lines are disposed on the substrate and arranged in a same layer as the plurality of power supply voltage lines; and an orthographic projection of the at least one fourth conductive pattern on the substrate does not overlap with orthographic projections of the plurality of data lines on the substrate.

15. The display device according to claim 13, wherein the display panel further includes a plurality of first conductive patterns disposed on the substrate;

in a direction perpendicular to a plane where the substrate is located, the plurality of first conductive patterns are located between the plurality of first signal lines and the plurality of second signal lines; and a second signal line of the plurality of second signal lines is coupled to a first signal line of the plurality of first signal lines through a first conductive pattern of the plurality of first conductive patterns.

16. The display device according to claim 13, wherein the display panel further includes a plurality of second conductive patterns disposed on the substrate, the plurality of second conductive patterns being coupled to the plurality of first signal lines;

the pixel circuit includes a first reset transistor and a second reset transistor; the first reset transistor and the second reset transistor are each coupled to a second conductive pattern; and a second signal line of the plurality of second signal lines is coupled to one of the first reset transistor and the second reset transistor through a second conductive pattern coupled to the one of the first reset transistor and the second reset transistor.

* * * * *